United States Patent [19]

Marion et al.

[11] Patent Number: 5,487,801
[45] Date of Patent: Jan. 30, 1996

[54] PRE-PROOF TEMPERATURE CONTROLLING ASSEMBLY

[75] Inventors: Michael P. Marion, Wallingford; David C. Otto, Kennett Square, both of Pa.

[73] Assignee: E. I. Du Pont de Nemours and Company, Wilmington, Del.

[21] Appl. No.: 344,756

[22] Filed: Nov. 23, 1994

Related U.S. Application Data

[62] Division of Ser. No. 110,458, Aug. 23, 1993, abandoned.

[51] Int. Cl.⁶ .................................................... B32B 31/00
[52] U.S. Cl. ........................... 156/64; 156/247; 156/359; 156/498; 430/33; 430/293
[58] Field of Search .............................. 156/64, 230, 235, 156/247, 344, 359, 498; 430/33, 40, 42, 200, 202, 203, 291, 292, 293

[56] References Cited

U.S. PATENT DOCUMENTS

| | | | |
|---|---|---|---|
| 3,655,372 | 4/1972 | Krohn et al. | 430/40 |
| 3,671,236 | 6/1972 | Beusekom | 96/15 |
| 3,776,721 | 12/1973 | Krohn et al. | 430/40 |
| 3,791,823 | 2/1974 | Carreira | 430/33 |
| 4,053,313 | 10/1977 | Fan | 96/36 |
| 4,364,892 | 12/1982 | Rehlen et al. | 264/284 |
| 4,376,158 | 3/1983 | Spechler | 430/291 |
| 4,376,159 | 3/1983 | Spechler | 430/293 |
| 4,416,719 | 11/1983 | Horiuchi | 156/359 |
| 4,656,114 | 4/1987 | Cederberg et al. | 430/160 |
| 4,659,927 | 4/1987 | Tago et al. | 250/318 |
| 4,666,817 | 5/1987 | Sachi | 430/160 |
| 4,962,314 | 10/1990 | Hirota et al. | 250/318 |
| 4,997,507 | 3/1991 | Meyer | 156/286 |
| 5,059,996 | 10/1991 | Bailey et al. | 354/317 |
| 5,075,722 | 12/1991 | Adolphson et al. | 355/77 |
| 5,160,399 | 11/1992 | Ueda et al. | 156/359 |
| 5,236,542 | 8/1993 | Bailey et al. | 156/583.1 |
| 5,288,357 | 2/1994 | Yamada et al. | 156/249 |

FOREIGN PATENT DOCUMENTS

| | | | |
|---|---|---|---|
| 0163300A2 | 12/1985 | European Pat. Off. | G03D 9/00 |
| 0319772A2 | 6/1989 | European Pat. Off. | B29C 67/18 |
| 0485861A1 | 5/1992 | European Pat. Off. | G03F 3/10 |
| 2500786 | 9/1982 | France | B29C 27/14 |
| 4211866A1 | 10/1992 | Germany | B29C 67/12 |
| 2144867A | 3/1985 | United Kingdom | G03C 1/54 |

OTHER PUBLICATIONS

Patent Abstracts of Japan, J56-69115(A), vol. 5, No. 135, (M-85) (807), Aug. 27, 1981.
Patent Abstracts of Japan, J57-66921(A), vol. 6, No. 146, (M-147) (1024), Aug. 5, 1982.
Nylen, P. and Sunderland E., *Modern Surface Coatings*, John Wiley & Sons Ltd., London, 1965, Chapter 16, pp. 611–632.

*Primary Examiner*—David A. Simmons
*Assistant Examiner*—Paul M. Rivard
*Attorney, Agent, or Firm*—Thomas H. Magee

[57] ABSTRACT

The present invention relates to a pre-proof temperature controlling assembly associated with an off-press apparatus for laminating an image sheet to an image receiving substrate and, more particularly, for laminating a plurality of image sheets to the receiving substrate and then laminating a portion of the receiving substrate to a display sheet.

5 Claims, 15 Drawing Sheets

PRE-PROOF TEMPERATURE CONTROLLING ASSEMBLY

This is a division of application Ser. No. 08/110,458, filed Aug. 23, 1993 now abandoned in favor of continuing application Ser. No. 08/365,063, filed Jan. 5, 1995, now pending.

BACKGROUND OF THE INVENTION

1. Field of the Invention.

This invention relates to a pre-proof temperature controlling assembly associated with an off-press apparatus for laminating an image sheet to an image receiving substrate and, more particularly, for laminating a plurality of image sheets to the receiving substrate and then laminating a portion of the receiving substrate to a display sheet.

2. Description of Related Art

Reproduction of color image through printing is an involved process requiring a breakdown of an original image into a number of fundamental single color images and the eventual recombination of the single color images through multiple printings into a full color reproduction of the original. Color image reproduction typically includes the following steps.

First, using filtering and other photographic techniques a number of color separation transparencies or color separations are produced, typically four, each bearing a halftone dot and/or a continuous tone (contone) image corresponding, for instance, to magenta, cyan, yellow and black portions of the original. Second, a printing plate is made for each color separation by exposing a sensitized plate through one of the transparencies and developing the plate. Third, the printing plates are mounted on a multistage printing press which prints inks on a substrate, typically paper, sequentially and in register, one on top of another, four halftone and/or contone images corresponding to each of the color separations to create a full color reproduction of the original.

In the case of halftone images, the various colors are reproduced by the superposition of a multiplicity of dots of varying diameters and colors corresponding to the four color separations. Any deviation in the size or position of the printed dots results in color shifts in the final printed image. As a result of this reproduction process, setting up the press and printing a four color image is economically feasible typically only when employed for printing large quantities of a given original.

It is desirable to be able to predict the final image appearance before it is printed, and preferably before making printing plates by reviewing images made directly from the color separation transparencies. The art of evaluating the color separation transparencies and deciding whether the various colors have indeed been properly separated is called proofing. Proofing is a process which uses the color separations to create a colored image called a proof to visualize what the final printed image will look like typically without actually making printing plates and running the printing press. Proofing through the creation of proofs shows the printer and customer what the job will look like after printing, so changes can be made, if necessary, to the color separations before the job goes to press where it can waste expensive press time, paper and ink if it is not right. Proofs are used for many purposes including for customer approval, for checking compatibility of a number of subjects to be printed on the same plate or job, for internal quality checking and control, and for relatively small numbers of final reproductions.

For many years the only way to make proofs was to print them on a press. This involved making plates, mounting them on the press, making the press ready to run, and running a few prints. Proofs of this type are very expensive because they involve labor intensive operations and the use of expensive materials (e.g., plates) and cost intensive equipment (e.g., the press). Special proof presses have been built to eliminate the high costs of using production presses, but manpower costs are still high and special proof presses do not always reproduce the printing and visual characteristics of the production press. Furthermore, press proofing by either of these techniques takes a long time to make proofs.

Because of the time and expense to make press proofs attempts have been made to develop and use less expensive and faster alternatives to press proofs. These are usually made by photochemical or photomechanical means and are referred to as off-press, pre-press or pre-plate proofs.

Photochemical or photomechanical proofing systems typically use photosensitive elements in making proofs. These systems generally make proofs by exposing photosensitive elements to actinic radiation through one of the image bearing color separation transparencies to produce a duplicate image that is either a positive or a negative of the transparency depending on the element used. The radiation may make soluble areas insoluble, insoluble areas soluble, tacky areas nontacky, or nontacky areas tacky depending on the element used. After imagewise exposure, the photosensitive element can be developed by washing out soluble areas. Then tacky areas of the element may have to be toned with a dry or liquid colorant. This process is repeated for all color separations. Then the processed elements are laminated together one at a time sometimes on a support or substrate. Protective layers may be peeled apart and removed from the elements before they are laminated to the support or other image elements. Finally, the four color images may be transferred from the support to a receptor, transfer or display sheet, such as a sheet of paper, to form the final proof.

Many photosensitive elements used for image reproduction have the disadvantage that they must be washed out by an organic solvent or aqueous base. For instance, U.S. Pat. No. 4,053,313 to Fan discloses a photosensitive element comprising a solvent-processable photosensitive layer, a tonable elastomeric layer and a support, that is processed (i.e., washed-out) by a mixture of water and organic solvent. The elements disclosed in U.S. Pat. Nos. 4,376,158 and 4,376,159 to Speckler require aqueous base for washout. Precolored diazo based photosensitive elements which are developed in a mixture of 1-propanol and water are disclosed, for example, in U.S. Pat. No. 3,671,236 to Van Beusekom, U.S. Pat. No. 4,656,114 to Cederburg and U.S. Pat. No. 4,666,817 to Sachi. Use of organic solvents or aqueous bases frequently is undesirable due to flammability, toxicity, corrosion and/or waste disposal considerations. The photosensitive elements disclosed in these Fan and Speckler Patents also require the developed (i.e., washed-out) elements to be toned either manually or in a toning apparatus.

Photosensitive elements are known and are being developed that do not have the above described disadvantages. Specifically, U.K. Patent publication GB 2144867 B discloses photosensitive elements having entirely aqueously developable precolored layers containing a colorant on a removable support. The U.K. Patent further describes a photomechanical process for forming a multicolor image, suitable for use as an off-press proof utilizing the aqueously developable photosensitive elements. The process for preparing a multicolor image is accomplished by (1) imagewise exposure of a first one of the precolored photosensitive elements comprising an aqueously developable precolored photosensitive layer on a removable support through a first one of the color separation transparencies forming image areas and non-image areas in its aqueously developable precolored layer, (2) processing the exposed element to develop the color image by washing away the non-image areas with water, (3) laminating the image bearing element to a substrate, and then (4) peeling the removable support from the image bearing element. A second color image element is made by exposing a second precolored photosensitive element with a second one of the color separation transparencies, processing to develop the color image, laminating in register the second color image element to the first color image element on the substrate and peeling the removable support from the second color image element. By repeating the exposing, processing, laminating in register, and peeling steps two more times, a four color image can be obtained. As long as the emulsion layer of the color separation contacts the photosensitive layer in the photosensitive element during the exposure step as is preferred, the process described in this U.K. Patent results in a wrong reading proof on the substrate. This means that the image on the substrate is a mirror image of that captured in the color separations.

Often it is desirable to view the multicolored image on a receptor or a transfer sheet, such as paper, which is the same as or similar to that which will be used in the final printing run. In this case, the multicolor image is transferred to the desired receptor by laminating and then peeling away the substrate. This results in a right reading proof assuming the emulsion layer of the color separation contacts the photosensitive layer in the photosensitive element during the exposure step. A right reading proof is the same as the original image, not a mirror image.

Many apparatuses have been developed for laminating photosensitive elements. Different laminating apparatuses are designed and used for laminating different photosensitive elements. However, aqueously developable precolored photosensitive elements are a relatively recent development. As such, few apparatuses exist for use in laminating aqueously developed precolored photosensitive elements or image sheets to supports or receiving substrates.

U.S. Pat. No. 4,659,927 to Tago et al. assigned to Fuji Photo Film Co., Ltd., discloses a laminator and a method utilizing the laminator for preparing a multicolor proof on a support plate of good thermal conductivity. The laminator comprises a pair of insertion rollers for feeding superposed sheets on the support plate into the laminator, a pair of heated rollers for receiving the sheets and plate from the insertion rollers and for heating and applying pressure to the sheets and plate, and a pair of cooling rollers for cooling the sheets and plate fed from the heated rollers.

A laminator is commercially available from Fuji Photo Film Co., Ltd., for laminating aqueously developed precolored photosensitive elements or image sheets to supports or receiving substrates. The laminator includes the parts described in the aforedescribed Fuji Patent. The laminator operates at one nip distance and pressure setting limiting its use with a variety of photosensitive elements, supports or receiving substrates and final transfer or display sheets. Only one of the heated rollers is driven by a motor. The other heated roller is rotated by frictional contact through the sheets sandwiched between the rollers, This causes slippage of the layers in the sheets during the laminating causing misregistration of colors in reproduced images and transfer irregularities.

U.S. Pat. No. 5,075,722 and U.S. patent application Ser. No. 07/612,975 disclose an off-press apparatus for laminating aqueously developed precolored photosensitive elements or image sheets to supports or receiving substrates using a carrier plate in the process. This laminator operates at more than one operating pressure or linear force setting enabling its use with a variety of photosensitive elements, supports or receiving substrates and final transfer or display sheets. This laminator includes means for driving a first roller assembly and a second roller assembly such that the magnitude of the tangential velocity of a point on the circumference of the first roller assembly is the same as the magnitude of the tangential velocity of a point on the circumference of the second roller assembly. This reduces slippage of the layers in the sheets during the laminating.

A difficulty associated with laminate-in-register systems, such as those disclosed in U.S. Pat. Nos. 5,075,722 and 4,659,927, is in laminating a processed color image element to the receiving substrate without causing any image distortion. Image distortion can be seen when dots of a color image of subsequent color laminations do not lay in proper position to dots of a previous layer color image. The mis-alignment or mis-registration of the dots of each color image element is referred to as registration error. Registration error becomes noticeable as a color shift when dots are mis-registered by more than half the diameter of the typical sized dot. In commercial 200 lines per inch printing, this maximum registration error would translate to about 63 microns.

A need exists to provide a method and apparatus for laminating a color image sheet to an image receiving substrate with improved registration of resulting proofs. Particularly, this need exists in off-press apparatus for laminating aqueously developed precolored photosensitive elements or image sheets to supports or receiving substrates using a carrier plate in the process.

SUMMARY OF THE INVENTION

The invention relates to an improvement in an off-press apparatus for laminating an image sheet to an image receiving substrate supported on a carrier plate, the apparatus comprising:

a laminator comprising:
  a support frame having a right frame and a left frame;
  a first lamination roller assembly rotatably mounted between the right frame and the left frame;
  a second lamination roller assembly rotatably mounted between the right frame and the left frame parallel or substantially parallel to the first roller assembly forming a nip between the roller assemblies;
  means for rotating the first roller assembly and/or the second roller assembly;
  means for heating the first lamination roller assembly and the second lamination roller assembly to about a first temperature; and
  a housing for substantially enclosing the first lamination roller assembly, the second lamination roller assembly, and the heating means, the housing having a housing inlet and a housing outlet, the housing retaining heat generated by the heating means within the housing generally at a second temperature below the first temperature;

a sheet preparation and feed table having an end mounted to the laminator adjacent the housing inlet; and a sheet output receiving table having an end mounted to the laminator adjacent the housing outlet; the improvement comprising:

pre-proof temperature controlling assembly comprising:

a tray with a top surface and a bottom surface, the top surface extending from the housing inlet to about the nip such that when an image sheet is placed or stacked on an image receiving substrate on a carrier plate on the table and the stacked sheet, substrate and carrier plate are slid along the table into the housing inlet along the top surface of the tray into the nip between the first roller assembly and the second roller assembly, the roller assemblies will transport the stacked sheet, substrate and carrier plate between the roller assemblies, laminate the sheet and substrate together and transport the laminated sheet and substrate and the carrier plate out the housing outlet onto the sheet output receiving table; and means for controlling the temperature of the stacked sheet, substrate and carrier plate on the tray at about a third temperature above room temperature and below the second temperature while the stacked sheet, substrate and carrier plate are being fed to and then transported between the roller assemblies.

BRIEF DESCRIPTION OF THE DRAWINGS

The invention can be more fully understood from the following detailed description thereof in connection with accompanying drawings described as follows.

DESCRIPTION OF THE PREFERRED EMBODIMENT(S)

A substantial contributor to registration error is from the dimensional instability of a polyester base used in each of the color image elements and the receiving substrate. Inherently the polyester base changes dimensions, i.e., expands, when heated, but eventually returns close to its original dimensions when returned to room temperature. Since during lamination, the color image of the color image element transfers from the element to the receiving substrate, the position of the dots of the color image, i.e., registration, is influenced by the dimensional changes that occurs for each base.

The dimensional stability of the color image elements and the receiving substrate is influenced by the thermal energy, i.e., heat, applied to the lamination stack, i.e., the color image element and receiving substrate. If the applied thermal energy experienced by the lamination stack is not uniform, the dimensional instabilities of the element and the substrate cause distortion of the image which results in registration error in a proof. Prior to the present invention, non-uniformities in the lamination process have been mitigated primarily by assuring that temperature and pressure profiles of the nip rollers in the laminator are constant.

However, the use of a carrier plate in an off-press laminating apparatus introduces a non-uniformity to the thermal energy applied to the lamination stack during lamination. As the lamination stack passes through heated nip rollers in the laminator, heat wicks up, i.e., travels, the carrier plate and preheats the lamination stack. The heat wicking results in the trailing portion of the lamination stack experiencing the applied thermal energy for a longer period of time than the leading portion of the lamination stack. This phenomena causes an ever increasing applied thermal energy down the length of the lamination stack.

It has been discovered that a pre-proof temperature controlling assembly 8 (FIG. 1) in accordance with the present invention effectively prevents heat wicking up the carrier plate and maintains the uniformity of the applied thermal energy to all locations on the lamination stack. The result is a reduction in the dimensional changes of the color image elements and receiving substrate which in turn improves registration of the proof.

Figure 1:
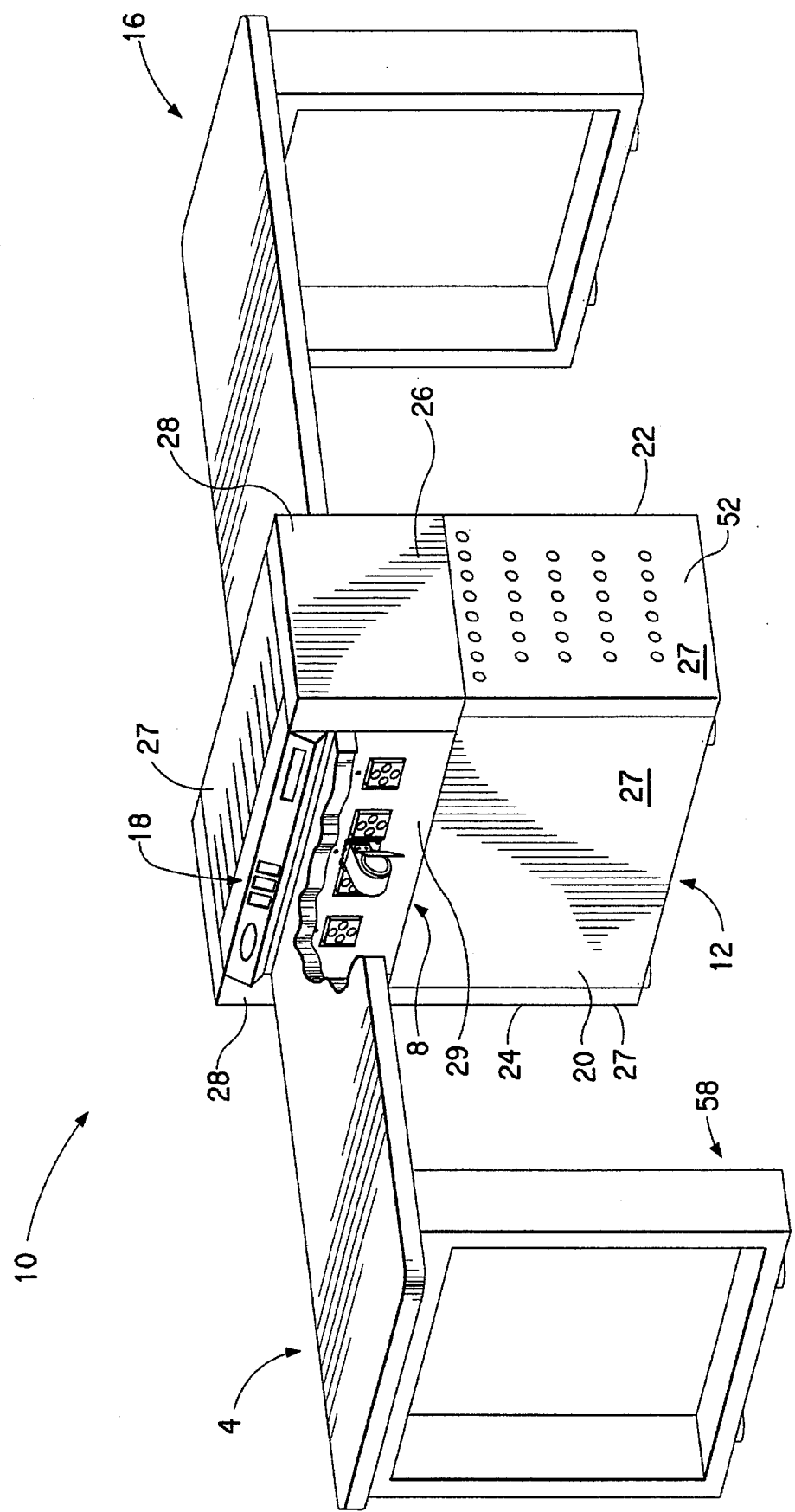
FIG. 1 is a perspective view of a first embodiment of a pre-proof temperature controlling assembly in an off-press apparatus for laminating an image sheet to an image receiving substrate supported on a carrier plate in accordance with the present invention.

Referring to FIG. 1, there is illustrated a perspective view of the pre-proof temperature controlling assembly 8 in an off-press laminating apparatus 10 for laminating an image sheet to an image receiving substrate supported on a carrier plate in accordance with the present invention. The term "off-press" is meant to be equivalent to the terms pre-press and pre-plate. The off-press laminating apparatus 10 generally comprises a laminator 12, a sheet preparation and feed table 14 and a sheet output receiving table 16.

Figure 2:
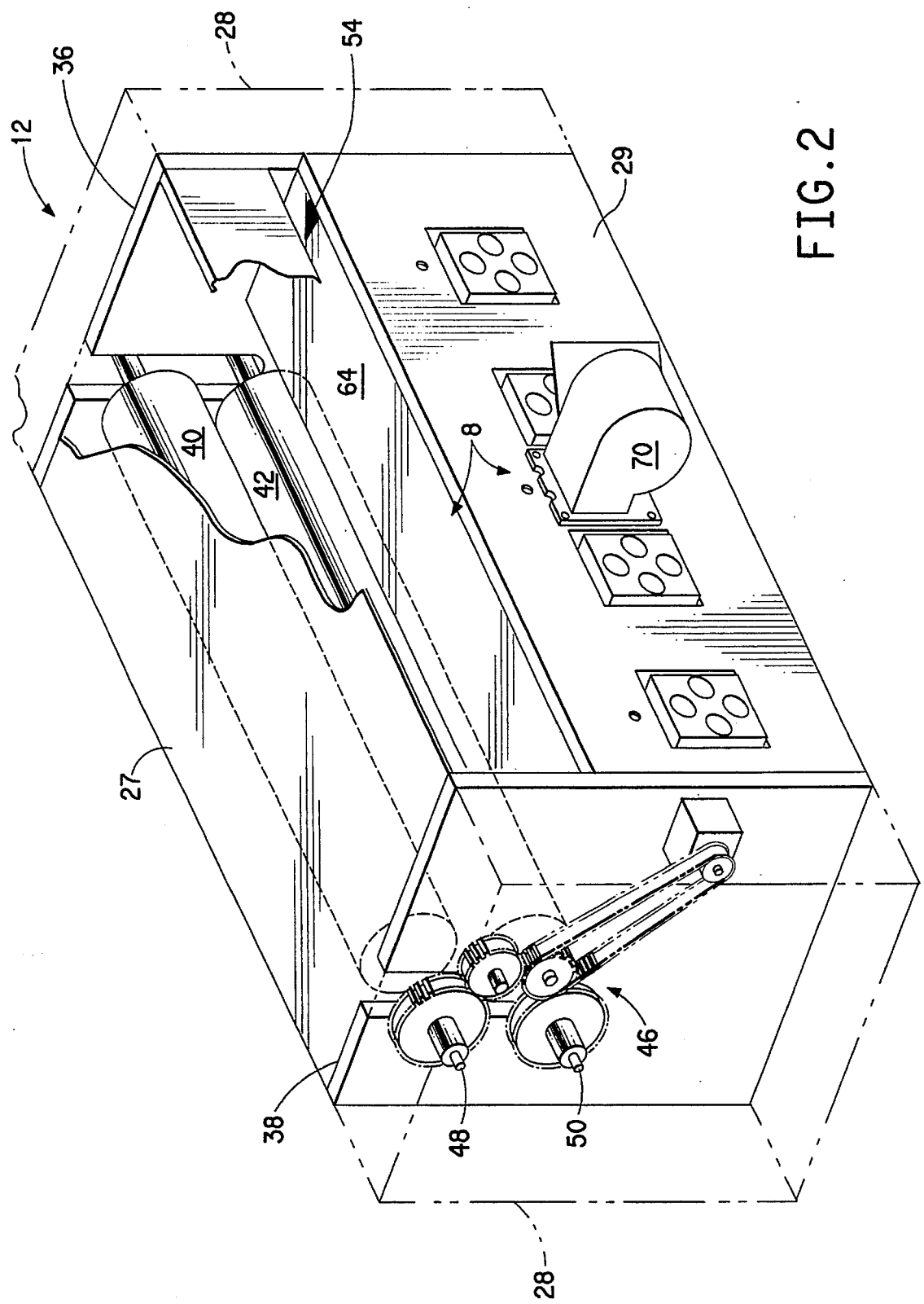
FIG. 2 is a perspective view of the pre-proof temperature controlling assembly and part of a laminator included in the off-press apparatus of FIG. 1 with housing panels shown in phantom line to show internal parts.
Figure 3:
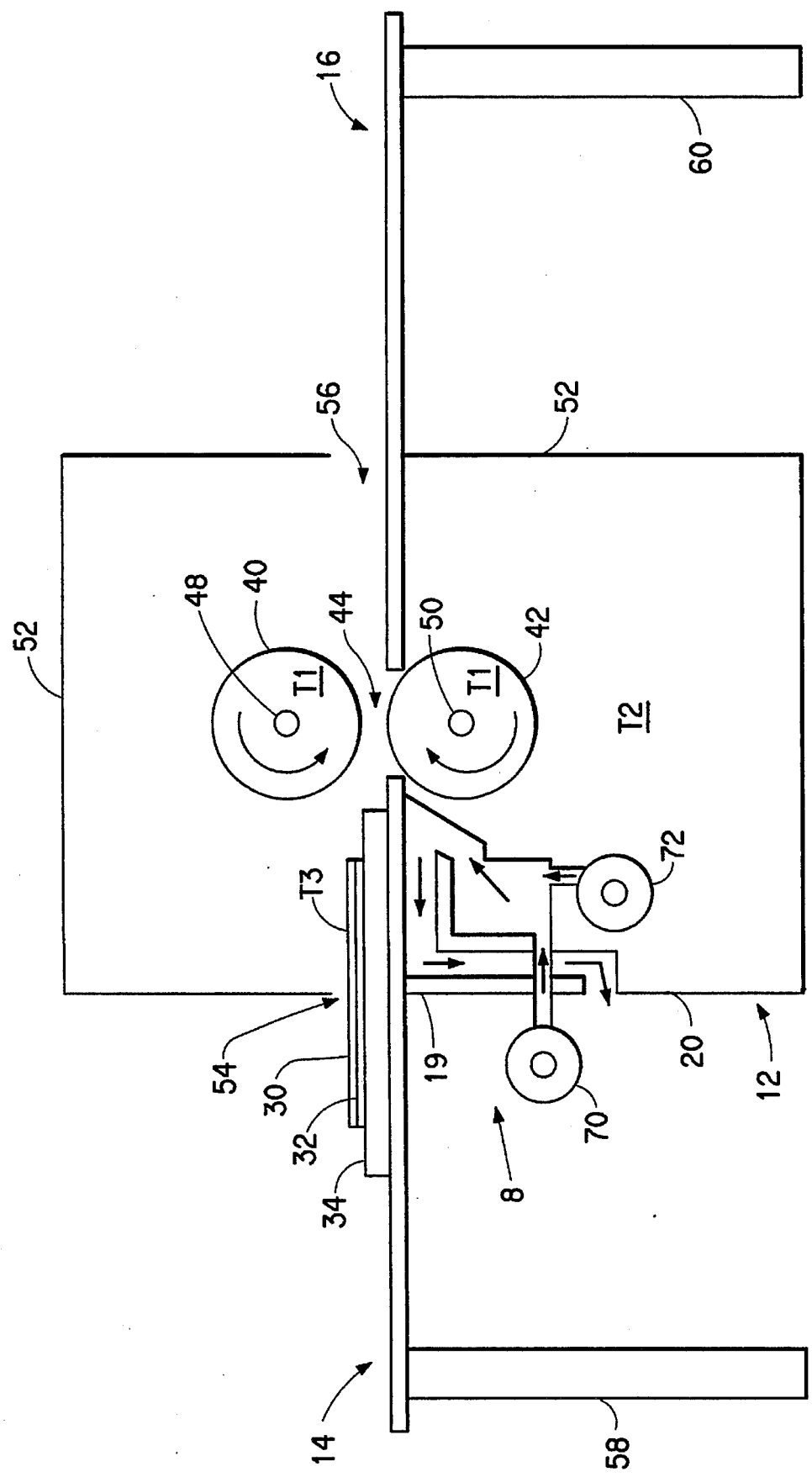
FIG. 3 is a schematic illustration of the pre-proof temperature controlling assembly in the off-press apparatus of FIG. 1.

The laminator 12 comprises a front side 20, a rear side 22, a left side 24 and a right side 26. An operator control pad 18 is conveniently located on the laminator 12. FIG. 2 is perspective view showing the pre-proof temperature controlling assembly 8 and part of the laminator 12 with housing panels 28 shown in phantom lines to show internal parts. FIG. 3 is a schematic illustration of an image sheet 30 on an image receiving substrate 32 supported on a carrier plate 34 partially on the pre-proof temperature controlling assembly 8 in the off-press apparatus 10.

As best seen in FIG. 2, the laminator 12 comprises a support frame having a right frame 36 and a left frame 38. The laminator 12 further includes a first lamination roller assembly 40 and a second lamination roller assembly 42. The first lamination roller assembly 40 is rotatably mounted between the right frame 36 and the left frame 38. The second lamination roller assembly 42 is rotatably mounted between the right frame 36 and the left frame 38 parallel or substantially parallel to the first roller assembly 40 forming a nip 44 between the roller assemblies 40,42. See FIG. 3. The laminator 12 further includes means 46 for rotating the first roller assembly 40 and the second roller assembly 42. The rotating means 46 can include gears and chains driven by a motor assembly possibly through the use of a gear box. The laminator 12 further includes means 48,50 for heating the first lamination roller assembly 40 and the second lamination roller assembly 42 to about a first temperature T1. The heating means 48,50 can comprise heaters or heater elements positioned in the first and second roller assemblies 40,42. A housing 52 substantially encloses the support frame 36,38, the first lamination roller assembly 40, the second lamination roller assembly 42, and the heating means 48,50. The housing 52 can comprise a plurality of housing panels 27,28,29. Referring to FIG. 3, the housing 52 has a housing inlet 54 and a housing outlet 56. The housing 52 serves to retain the heat generated by the heating elements 48,50 such that the air temperature within the housing 52 when the laminator 12 is operating is at a second temperature T2.

Referring to FIGS. 1 and 3, the sheet preparation and feed table 14 has a first end mounted to the laminator 12 adjacent the housing inlet 54. The table 14 extends from the front side 20 of the laminator 12 and is supported at a second end remote from the laminator 12 by legs or a support assembly 58. The sheet output receiving table 16 has a first end mounted to the laminator 12 adjacent the housing outlet 56. The table 16 extends from the rear side 22 of the laminator 12 and is supported at a second end remote from the laminator 12 by legs or a support assembly 60.

Figure 4:
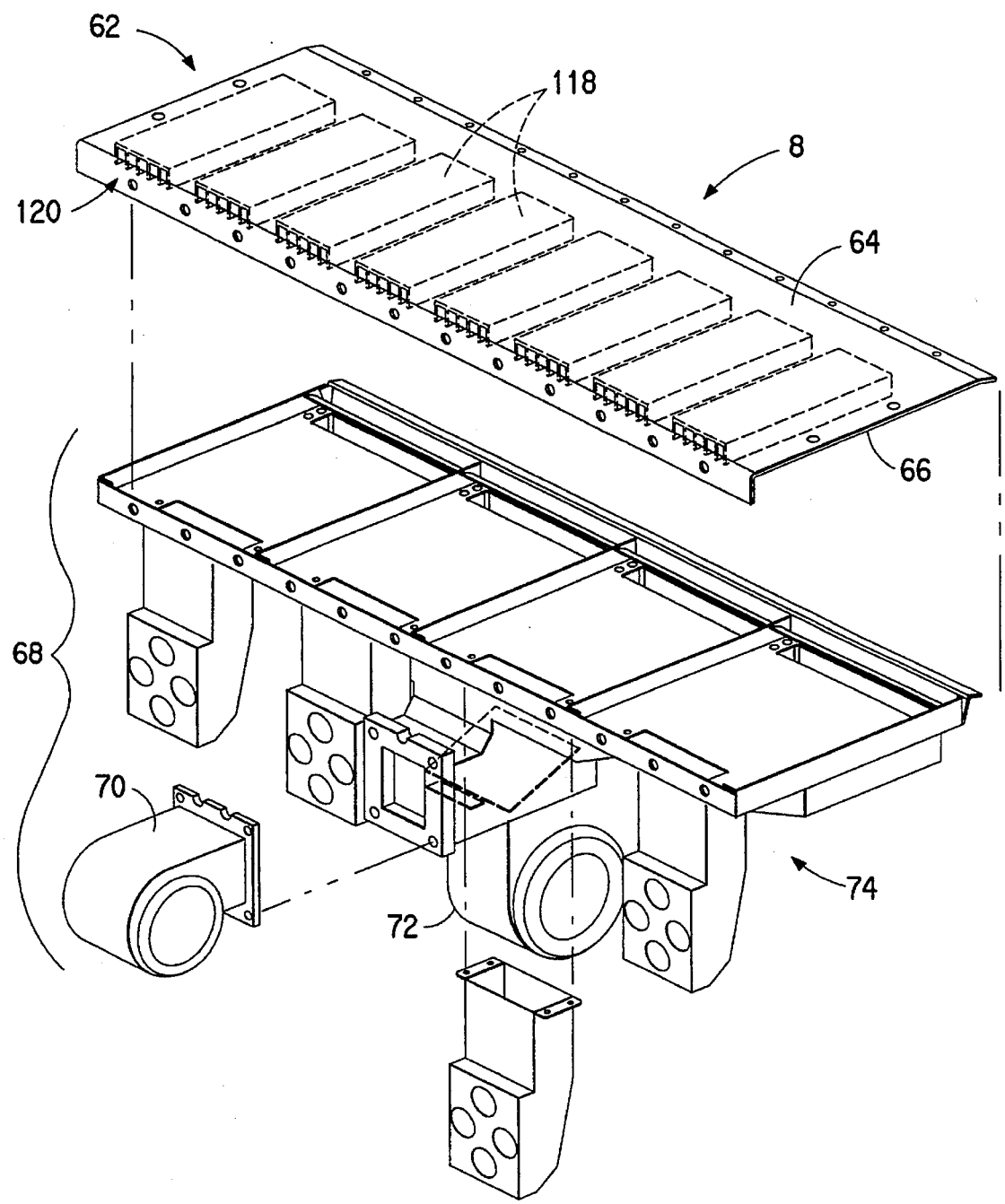
FIG. 4 is a perspective view of the pre-proof temperature controlling assembly with parts exploded from one another.

FIG. 4 is a perspective view of the pre-proof temperature controlling assembly 8 with parts exploded from one another. The pre-proof temperature controlling assembly 8 comprises a tray 62 with a top surface 64 and a bottom surface 66. Referring back to FIGS. 2 and 3, the top surface 64 extends from the housing inlet 54 to about the nip 44 such that when an image sheet 30 is placed or stacked on an image receiving substrate 32 on a carrier plate 34 on the table 14 and the stacked sheet 30, substrate 32 and carrier plate 34 are slid along the table 14 into the housing inlet 54 along the top surface 64 of the tray 62 into the nip 44 between the first roller assembly 40 and the second roller assembly 42, the roller assemblies 40,42 will transport the stacked sheet 30, substrate 32 and carrier plate 34 between the roller assemblies 40,42, laminate the sheet 30 and substrate 32 together and transport the laminated sheet 30 and substrate 32 and the carrier plate 34 out the housing outlet 56 onto the sheet output receiving table 16.

Figure 5:
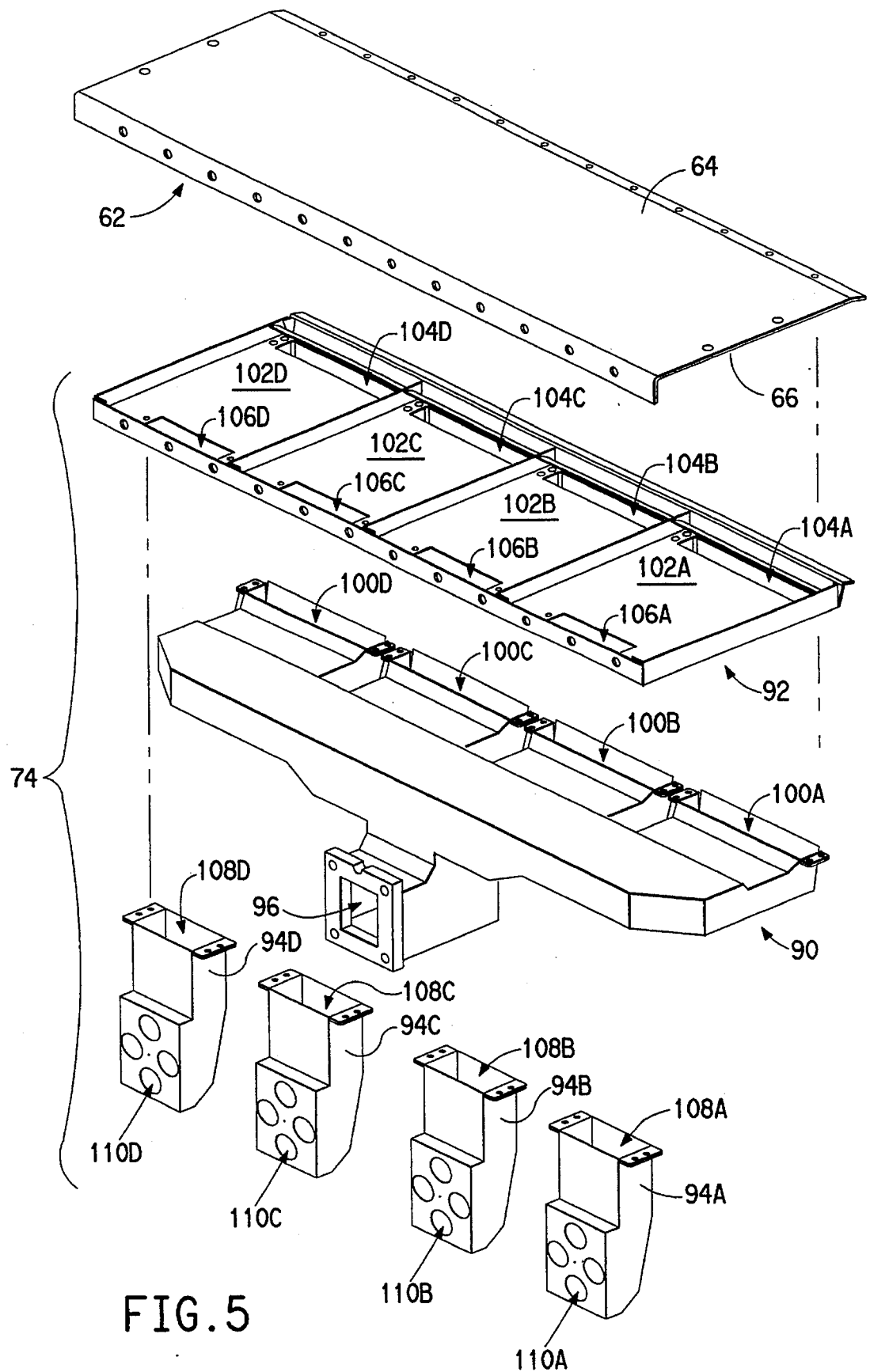
FIG. 5 is a perspective view of a manifold in accordance with the present invention with parts exploded from one another.

Referring to FIGS. 4 and 5, the pre-proof temperature controlling assembly 8 further comprises means 68 for controlling the temperature of the stacked sheet 30, substrate 32 and carrier plate 34 on the tray 62 at about a third temperature T3 above room temperature and below the second temperature while the stacked sheet 30, substrate 32 and carrier plate 34 are being fed to and then transported between the roller assemblies 40,42. Preferably, the temperature controlling means 68 comprises a first air blower 70, a second air blower 72, a manifold 74 and an electrical control system 76.

Figure 6:
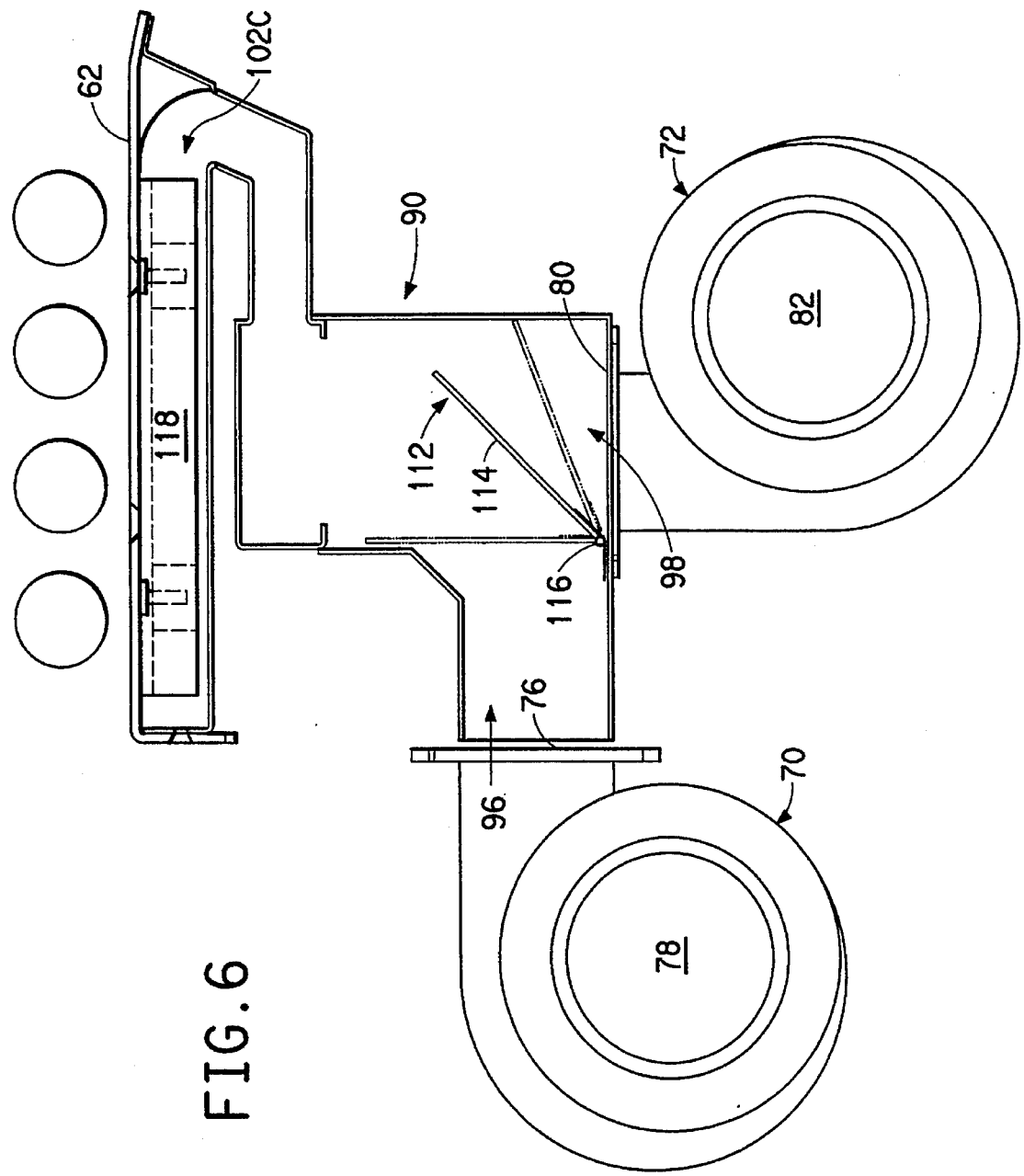
FIG. 6 is a Cross sectional view generally along a first plane through a first duct network and a third chamber of the manifold.
Figure 7:
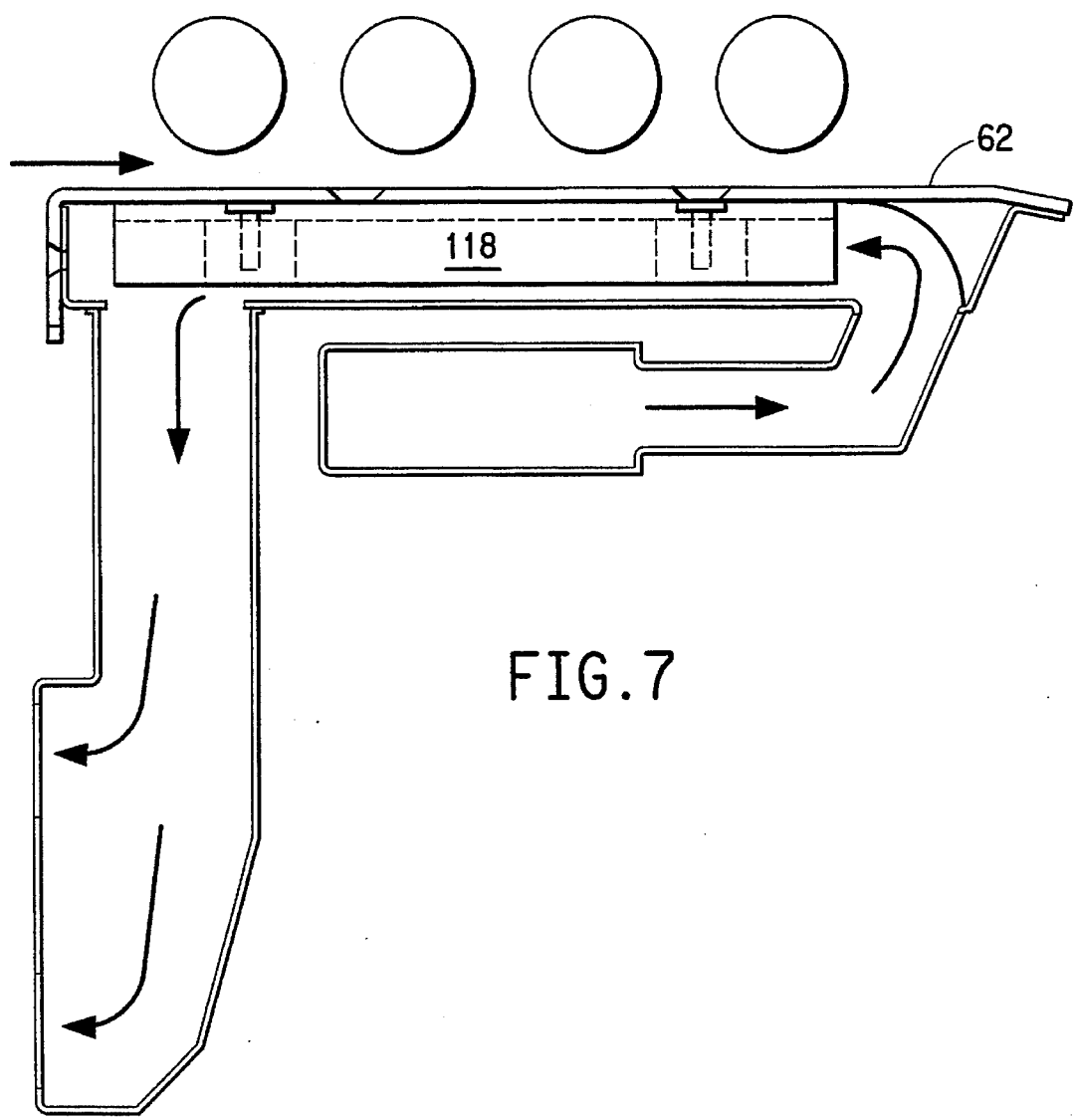
FIG. 7 is a cross sectional view generally along a second plane parallel to the first plane and bisecting the third chamber and a 2nd third duct network of the manifold.
Figure 8:
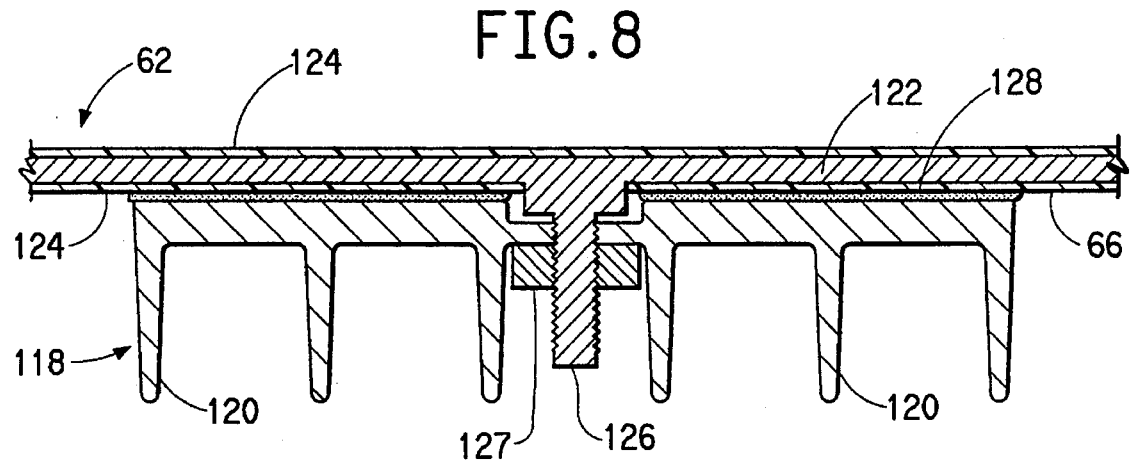
FIG. 8 is a cross section view of a heat sink extending from a bottom surface of a tray of the pre-proof temperature controlling assembly.

FIG. 6 is a cross sectional view generally along a first plane through the manifold 74. FIG. 7 is a cross sectional view through the manifold 74 generally along a second plane parallel to the first plane.

Referring to FIG. 6, the first air blower 70 can have a first blower outlet 76 and a first blower inlet 78 positioned to receive air at about a fourth temperature T4 below the third temperature from outside the housing 52. (See FIG. 3.) The second air blower 72 can have a second blower outlet 80 and a second blower inlet 82 positioned to receive air at about the second temperature T2 from inside the housing 52. (Again see FIG. 3.)

Referring to FIGS. 5 and 6, the manifold 74 can comprise a first duct network or duct 90, a second duct network or duct 92 and a plurality of third duct networks or ducts 94A–D. The first duct 90 has a first inlet 96, a second inlet 98 and a plurality of outlets 100A–D. The first duct first inlet 96 is connected to the first blower outlet 76. The first duct second inlet 98 is connected to the second blower outlet 80. The second duct 92 and the bottom surface 66 of the tray 62 define a plurality of chambers 102A–D. There can be any number of chambers 102. The embodiment illustrated in the Figures has a first chamber 102A, a second chamber 102B, a third chamber 102C, and a fourth chamber 102D. Each of the chambers 102A–D has an inlet 104A–D and an outlet 106A–D. One of the chamber inlets 104A–D is connected to each one of the plurality of first duct outlets 100A–D such that air blown through the chambers 102A–D cool or heat the tray 62. Each one of the third ducts 94A–D has an inlet 108A–D and an outlet 110A–D. One of the third duct inlets 108A–D is connected to each one of the chamber outlets 106A–D. If there are four chamber outlets 106A–D as illustrated in the Figures, there are four third ducts, i.e, a 1st third duct 94A, a 2nd third duct 94B, a 3rd third duct 94C and a 4th third duct 94D. The third duct outlets 110A–D are positioned to exhaust air to the environment outside of the housing 52. (See FIG. 3.)

Referring to FIGS. 4 and 6, the temperature controlling means 68 preferably further comprises means 112 in the manifold 74 for directing air from the first blower outlet 76 away from the second blower outlet 80 and for directing air from the second blower outlet 80 away from the first blower outlet 76. Preferably, the directing means 112 is a flapper valve comprising a light weight flat door 114 connected by a hinge 116 in the first duct 90 adjacent the first duct first inlet 96 and the first duct second inlet 98. When air is blown into the first duct first inlet 96 and air is not blown into the first duct second inlet 98, the flapper valve 112 is blown away from the first duct first inlet 96 and towards, thereby closing or blocking, the first duct second inlet 98. This directs the air out the first duct outlets 100A–D, rather than allowing the air to escape through the first duct second inlet 98. When air is blown into the first duct second inlet 98 and air is not blown into the first duct first inlet 96, the flapper valve 112 is blown away from the first duct second inlet 98 and towards, thereby closing or blocking, the first duct first inlet 96. Again this directs the air out the first duct outlets 100A–D, rather than allowing the air to escape through the first duct first inlet 96. When air is blown into the first duct first inlet 96 and air is simultaneously blown into the first duct second inlet 98, the flapper valve 112 is forced to an intermediate position allowing air to be blown in from both the first duct first inlet 96 and the first duct second inlet 98.

Referring to FIGS. 4, 6, 7 and 8, the tray 62 includes at least one thermally conductive heat sink 118 extending from the bottom surface 66 of the tray 62 into the manifold 74. Each heat sink 118 has ribs or fins 120 projecting into one of the chambers 102A–D. Preferably, the fins 120 extend longitudinally in the direction of air flow through the chambers 102A–D. The tray 62 and heat sinks 118 can be aluminum and cast or otherwise formed as one unit. Alternatively, as shown in the Figures, the tray 62 can be made of an aluminum plate 122 with a hard, smooth tetrafluoroethylene coating 124. Threaded studs 126 can be fixed to and extend from the bottom surface of the aluminum plate 122 which receive nuts 127 to secure individual aluminum heat sinks 118 to the bottom surface 66 of the tray 62 so as one of the heat sinks 118 extends into each one of the chambers 102A–D. A thin thermally conductive putty layer 128 can be applied between the tray 62 and the heat sinks 118 to increase the thermal conductivity between them.

Figure 9:
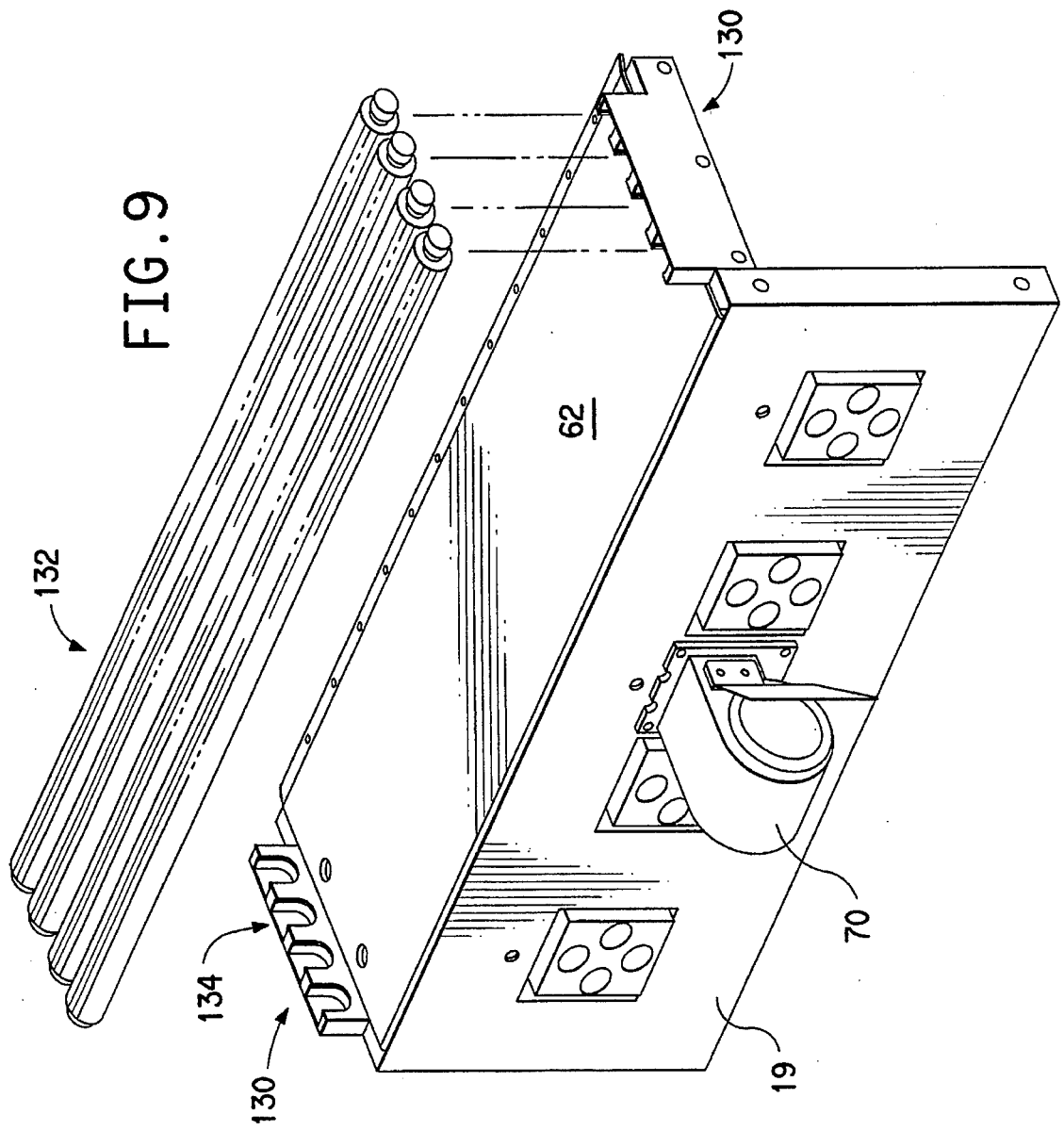
FIG. 9 is a perspective view of the pre-proof temperature controlling assembly of FIG. 1 with roller assemblies exploded away from the apparatus.

Referring to FIG. 9, preferably, the temperature controlling means 68 further comprises a pair of roller supports 130 supporting a plurality of non-lamination roller assemblies 132. One of the roller supports 130 can be mounted on each side of the tray 62 transverse to the direction of feeding a stacked sheet 30, substrate 32 and carrier plate 34 to the nip 44. Each support 130 can have a plurality of bearing retaining slots 134. Each one of the non-lamination roller assemblies 132 can have a roller, shafts and bearings. The rollers can extend above and transverse to the tray 62. The shafts can extend out ends of the rollers. The bearings can be rotatably supported on the shafts and retained in the bearing retaining slots 134. When the stacked sheet 30, substrate 32 and carrier plate 34 are slid along the top surface 64 of the tray 62 towards the nip 44, the non-lamination roller assemblies 132 apply a slight force on the stacked sheet 30, substrate 32 and carrier plate 34 maintaining the carrier plate 34 in contact with the tray 62. This increases and ensures good thermal conductivity between the tray 62 and the carrier plate 34.

The electrical control system 76 can comprise means for controlling the operation of the first blower 70 and the second blower 72 to maintain the temperature of the tray 62 substantially at the third temperature Preferably, the first temperature is about 100° C. (i.e., degrees Celsius), the second temperature is about 40–45° C., the third temperature is about 35° C., and the fourth temperature is about 25° C. This effectively cools the temperature of the tray 62. In a first embodiment, the electrical control system 76 operates the first blower 70 and the second blower 72 alternately at constant flow rates to maintain the temperature of the tray 62 substantially at the third temperature. In a second embodiment, both blowers can have variable flow rates. In a third embodiment, one of the blowers can be constantly blowing at a constant flow rate and the other blower can be turned on and off at a constant flow rate to control the temperature of the tray 62.

Figure 10:
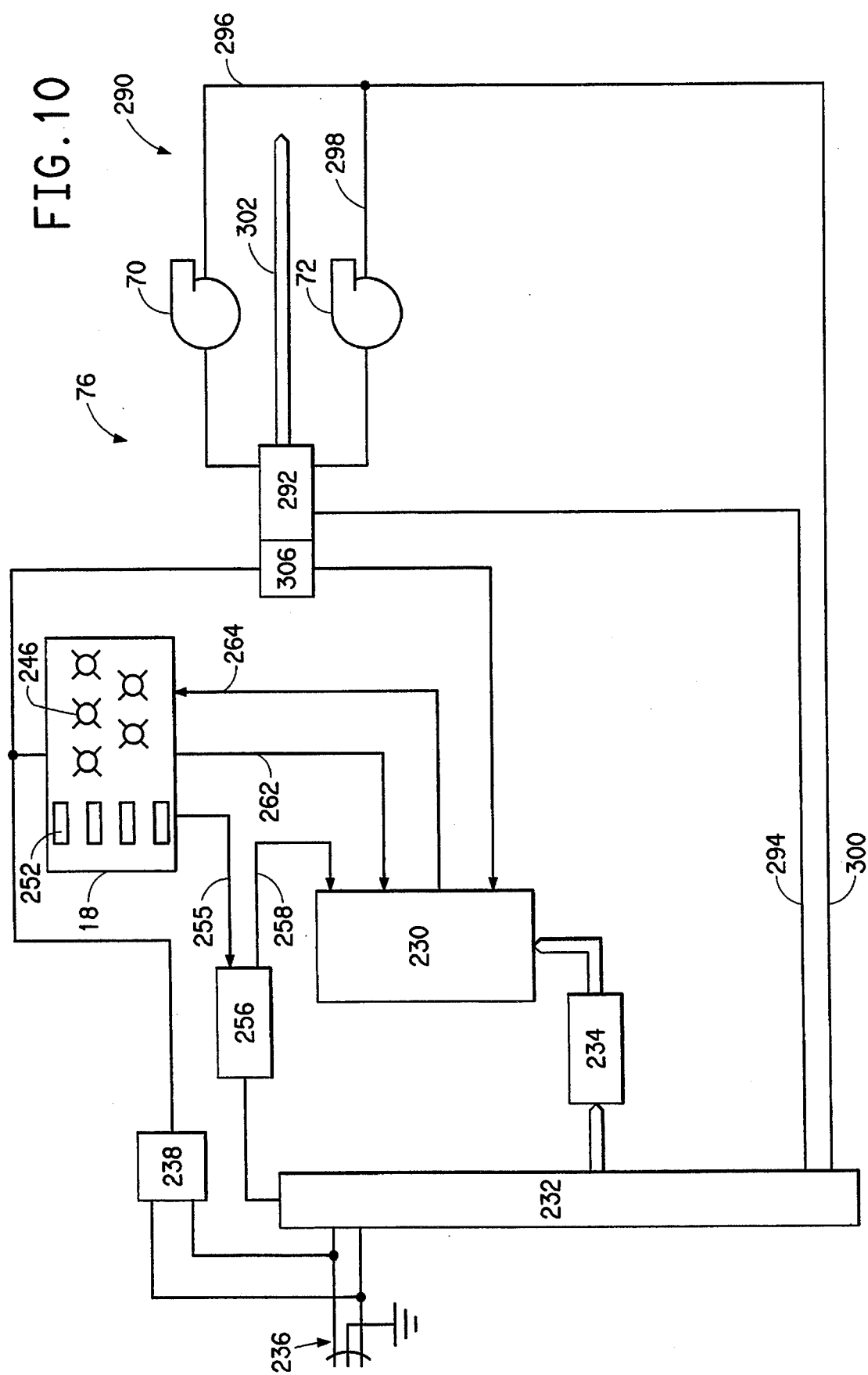
FIG. 10 is a schematic illustration of an electrical control system for the present invention.

FIG. 10 is a schematic illustration of the first embodiment of the electrical control system 76 for the pre-proof temperature controlling assembly 8 of the present invention. The electrical control system includes a programmable logic controller (PLC) 230 connected to a power distribution network 232 or the like through a step down transformer 234 which converts voltage, such as, from 220 Volts to 115 Volts at 50 Watts. A suitable PLC 230 that can be used in the present invention is commercially available under model number D100CR14 from Cutler Hammer with offices in Philadelphia, Pa. The suitable power distribution network 232 may include fuse blocks, terminal blocks and interconnections between components of the control system. For instance, the power distribution network 232 may be connectable by an input cable 236 to a power supply, such as a 220 Volt 16 Amp AC power supply (not depicted). Alternatively, the control system 76 could be designed to receive power from a 120 Volt AC power supply in which case the step down transformer 234 would not be needed.

The key pad 18 is connected by lines 262,264 to provide and receive signals from the PLC 230. A DC power supply 238 is connected between the input cable 236 and the control or key pad 18. The DC power supply 238 continuously provides DC power to all soft-on/soft-off power circuits in the control system 76. A power switching device 256 is connected by a line 255 between the control or key pad 18 and the power distribution network 232. A suitable power switching device 256 that can be used in the present invention is commercially available under model number CE15DN2B from Cutler Hammer. The power switching device 256 is a soft-on/soft-off circuit having several relays and a large contactor to handle the power. The soft-on/soft-off circuit 256 provides DC power to items connected to the DC power supply 238. A line 258 also interconnects the power switching device 256 with an input to the PLC 230.

The electrical control system 76 includes an electrical temperature control subsystem 290. The electrical temperature control subsystem 290 comprises a temperature controller 292 connected to a first line 294 which in turn is connected to the power distribution network 232. The first blower 70 and the second blower are connected in lines 296 and 298, respectively, in parallel between the temperature controller 292 and a line 300 which in turn is connected to the power distribution network 232. A temperature sensor or thermocouple 302 is positioned to sense the temperature of the tray 62 and is connected to provide signals representative of the sensed temperature to the temperature controller 292. Suitable temperature controllers 292 that can be used in the present invention are commercially available under model number PYZ4TDY1-IV from Fuji Electric of Japan. The temperature controller 292 includes an alarm circuit 306. The alarm circuit 306 is connected in series between the DC power supply 238 and the PLC 230.

In operation, the apparatus 10 is activated by pressing a "power on/off" toggle switch 252 which sends a signal to the device 256 over line 255. Then the device 256 applies power to the entire control system 76.

The temperature controller 292 also switches on in response to pressing the "power on" switch 252. The temperature controller 292 controls the temperature of the tray 62 based on manually inputted preset values and feedback from the temperature sensor 302.

A high temperature preset and a low temperature preset can be inputted to the alarm circuit 306. The alarm circuit 306 monitors the temperature being fed back from the temperature contact sensor 302. When the temperature of the tray 62 is between the inputted high and low temperature presets for the alarm circuit 306, the alarm circuit 306 is activated and closes a switch creating an electrical path through the alarm circuit 306. When the alarm circuit 306 is activated, a signal is sent from the alarm circuit 306 to the PLC 230. If the PLC 230 does not receive a signal from the alarm circuit 306, the PLC 230 sends a signal to activate an "error" lamp 246 indicating there is a temperature problem.

Figure 11:
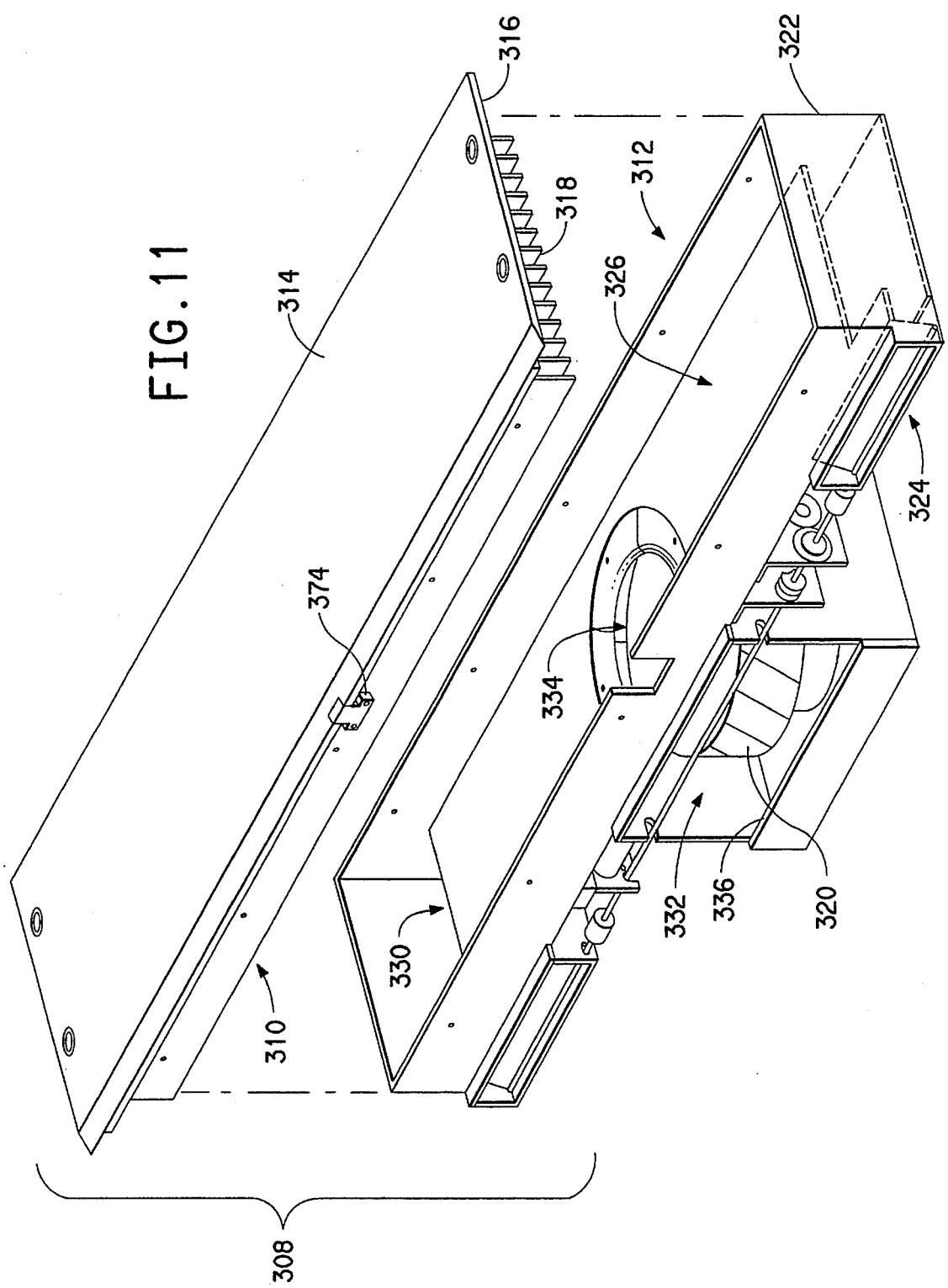
FIG. 11 is a perspective view of a second embodiment of a pre-proof temperature controlling assembly with parts exploded from one another.

FIG. 11 is a perspective view of a second embodiment of a pre-proof temperature controlling assembly 308. The second assembly 308 can be used in the off-press laminating apparatus 10, instead of and to perform the functions of the first assembly 8. Like the first assembly 8, the second pre-proof temperature controlling assembly 308 comprises a tray 310 and means 312 for controlling the temperature of the stacked sheet, substrate and carrier plate on the tray 310 at about the third temperature T3 while the stacked sheet, substrate and carrier plate are being fed to and then transported between the roller assemblies 40, 42.

The tray 310 has a top surface 314 and a bottom surface 316. The top surface extends from the inlet 54 to about the nip 44 and functions like the top surface 64 of the first assembly 8. The tray 310 includes ribs or fins 318 extending from the bottom surface 316 and extending transverse to the direction that the stacked sheet, substrate and carrier plate are slid and transported. The tray 310 and fins 318 are formed as one piece, such as being cast or extruded. The tray 310 and fins 318 are aluminum. A hard, smooth tetrafluoroethylene coating can be applied to the top surface 314.

Figure 12:
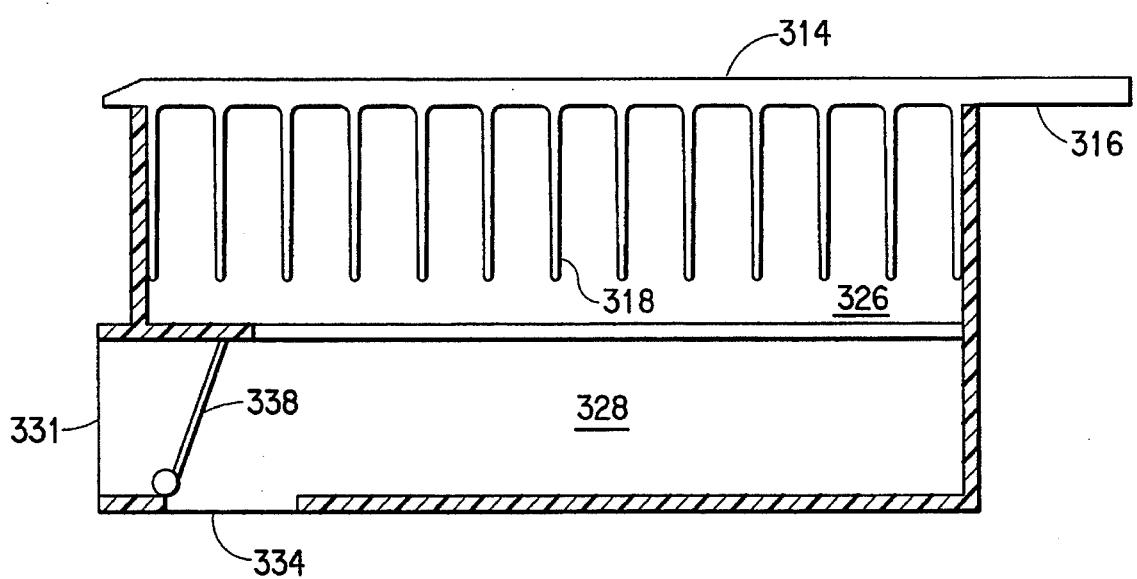
FIG. 12 is a cross sectional view generally along a first plane through the pre-proof temperature controlling assembly of FIG. 11.

The controlling means 312 comprises an air blower 320, a manifold 322, and a flapper mechanism 324. The air blower 320 is preferably a motorized impeller. The manifold 322 comprises or defines a main longitudinal chamber 326 which extends transverse to the direction that the stacked sheet, substrate and carrier plate are moved. The fins 318 extend in the main chamber 326. The manifold 322 further comprises or defines a first inlet chamber 328 and a second inlet chamber 330. The first inlet chamber 328 connects to a first end of the main chamber 326. The second inlet chamber 330 connects to a second end of the main chamber 326. FIG. 12 is a cross sectional view through the first inlet chamber 328.

Each inlet chamber 328, 330 includes an exterior port 331 positioned to receive air at T3 from outside the housing 52. Each inlet chamber 328, 330 also includes an interior port 334 positioned to receive air at T2 from inside the housing 52. Preferably, the inlet chambers 328, 330 are positioned below ends of the main chamber 326.

The manifold 322 further includes an outlet chamber 332 below and to the main chamber 326 connected by a passage 334. The passage 334 is spaced about mid way from the ends of the main chamber 326. The outlet chamber 332 has an exterior port 336 positioned to allow air to pass from the outlet chamber 332 to outside the housing 52. The impeller 320 is positioned in the outlet chamber 332 to draw air from the passage 334 and to exhaust air through the exterior port 336 exterior to the housing 52.

Figure 13:
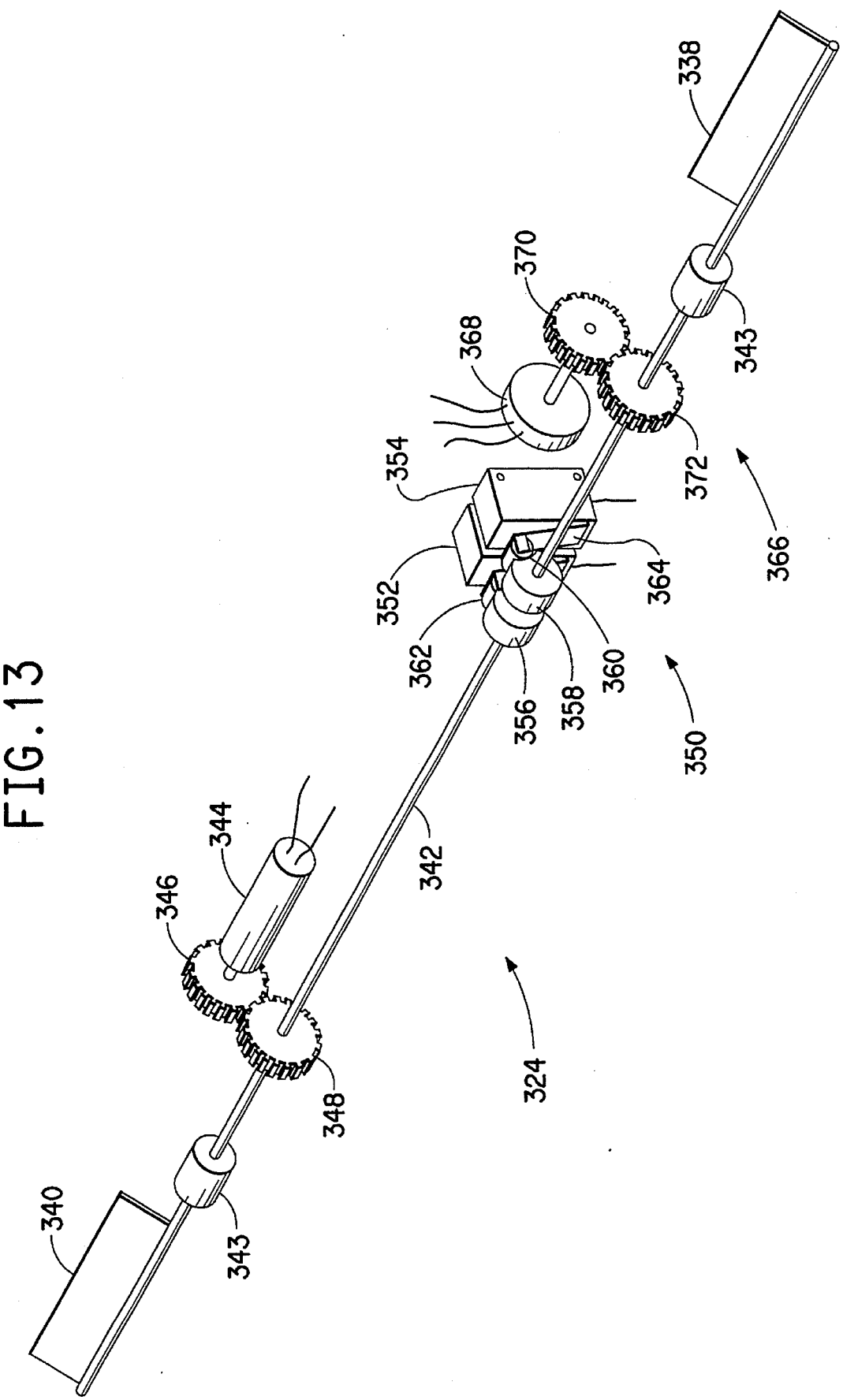
FIG. 13 is a perspective view of a flapper mechanism for directing air flow in the pre-proof temperature controlling assembly of FIG. 11.

The flapper mechanism 324 is best shown in FIG. 13. The flapper mechanism 324 comprises a first flapper 338 for controlling air flow through ports 331, 334 in inlet chamber 328, a second flapper 340 for controlling air flow through the ports 331, 334 in inlet chamber 328, 330, and a shaft 342 connected to the flappers 338, 340. A motor assembly 344 is adapted to rotate a motor gear 346 on the motor shaft. The motor gear 346 connects to and drives a shaft gear 348 on the shaft 342. Thus, when the motor assembly 344 is activated, it rotates the motor gear 346 which rotates the shaft gear 348 which rotates the shaft 342 and the flappers 338, 340. The shaft 342 can be one piece or a plurality of shaft segments connected by couplers 343.

The flapper mechanism 324 includes means 350 for limiting rotation of the shaft 342 and flappers 338, 340 by deactivating the motor assembly 344 when the flappers 338, 340 close the exterior ports 331 and when the flappers 338, 340 close the interior ports 334. The deactivating means 350 may include a first limit switch 352, a second limit switch 354, a first cam 356 on the shaft 342, a second cam 358 on the shaft 342. The first and second cams 356, 358 have recesses 360. A first detent 362 on the switch 352 extend into the recess 360 on the cam 356 deactivating rotation in one direction such as when the flappers 338, 340 close exterior ports 332. A second detent 364 on the other switch 354 extends into the recess 360 on the cam 358 deactivating rotation in the other direction such as when the flappers 338, 340 close interior ports 334.

The flapper mechanism 324 also includes means 366 for controlling the position, i.e., rotation, of the shaft 342 and the flappers 338, 340. The controlling means 366 may include a potentiometer 368, a pot gear 370 connected to a pot shaft, and a shaft gear 372 connected to the pot gear 370. The potentiometer 368 provides an electrical signal such as to a computer or other control system, indicative of the position, i.e., rotation, of the shaft 342. In response to this signal and other inputs, such as a signal representing the temperature of the tray 310 from a temperature sensor (not depicted), the computer or other control system can be programmed to control the motor assembly 344 to position the flappers 338, 340 to maintain the temperature of the tray 310 at a predetermined temperature.

Referring to FIG. 11, a sensor 374 can be provided at the leading edge of the tray 310. The sensor can be connected to the computer to cause the flappers 338, 340 to close the exterior ports for a predetermined time period to increase the temperature of the tray 310 when a carrier plate initially passes onto the tray 310.

The laminator 12 can be like the laminator disclosed in U.S. Pat. No. 5,075,722 and/or U.S. patent application Ser. No. 07/612,975 with the exceptions expressly noted in this specification. Suitable parts for the laminator 12 including the lamination roller assemblies 40,42, the rotating means 46, the heating means 48,50, and much of the electrical control system 76 are disclosed in more detail in U.S. Pat. No. 5,075,722 and U.S. patent application Ser. No. 07/612, 975 which are hereby incorporated by reference.

A preferred carrier plate suitable for use in this invention is described in co-pending U.S. Patent application serial number (Attorney docket number IM-0827) and filed the same day as this specification.

The off-press apparatus 10 of the present invention can be used to perform an off-press method for laminating at least one color image sheet to an image receiving substrate and then transferring the color image(s) from the receiving substrate to a transfer sheet to form a proof.

Figure 14:
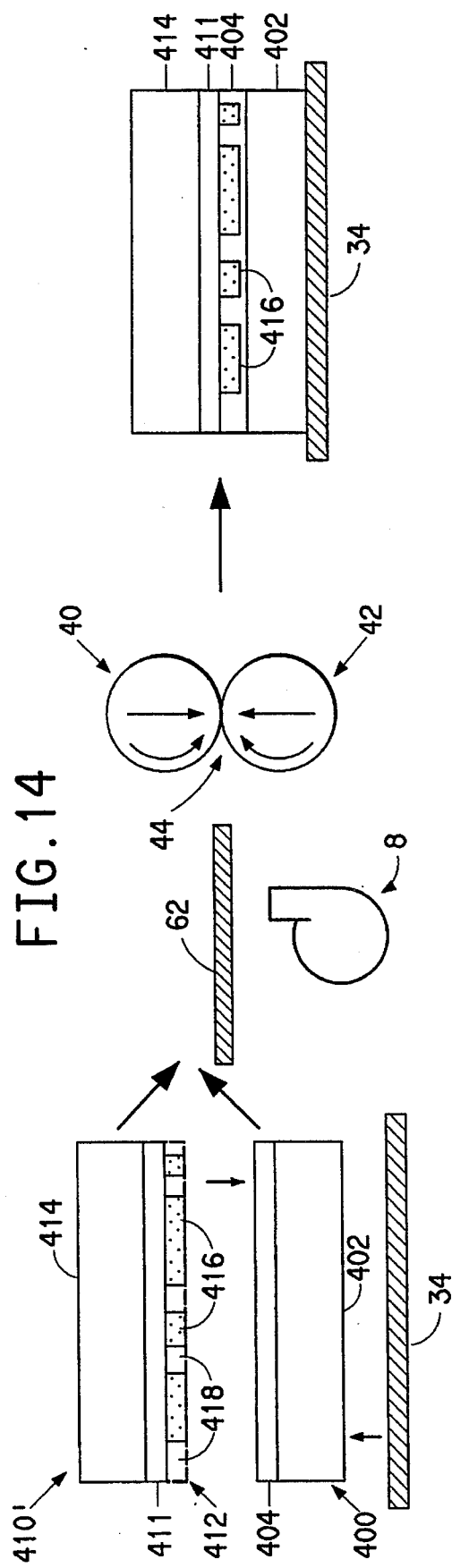
FIG. 14 is a schematic illustration of laminating by applying pressure and heat through a nip between a first roller assembly and a second roller assembly to sandwich an image sheet having one colored image together with a receiving substrate having no colored images.

Specifically, referring to FIG. 14, a first precolored photosensitive element 410 comprising a first aqueously developable precolored photosensitive layer 412 on a first removable support 414 is exposed to actinic radiation through a first color separation transparency forming first image areas 416 and first non-image areas 418 in the first aqueously developable precolored layer 412. The first precolored photosensitive element 410 may include a first adhesive layer 411 between the first photosensitive layer 412 and the first removable support 414.

Next, the exposed first element 410' is processed to develop a first color image by washing away the first non-image areas 418 with water.

Next, the first image bearing element 410' is stacked in registration on the substrate 400 on the carrier plate 34 on the sheet preparation and feed table 14 of the laminator 12. See FIGS. 3 and 14.

Next, the stacked first image bearing element 410', substrate 400 and carrier plate 34 are slid along the tray 62 into the nip 44 between the pair of roller assemblies 40,42 heated to about the first temperature T1 and which are parallel or substantially parallel.

Then, the first image bearing element 410' is laminated to the intermediate receiving substrate 400 by transporting the first image bearing element 410' on the substrate 400 through the roller assemblies 40,42 (heated by the heater elements 49,50) which are parallel or substantially parallel and which apply a first operating pressure or linear force OLF1 on the first image bearing element 410' and the substrate 400. This first laminating step is illustrated in FIG. 14. The substrate 400 may include a support layer 402 and an adhesive layer 404. FIG. 14 is a schematic illustration of laminating by applying pressure and heat through a nip 44 set to apply a first operating pressure or linear force OLF1 by the first roller assembly 40 and the second roller assembly 42 to sandwich the image bearing element 410' having one colored image 416 together with the receiving substrate 400 having no colored images.

During the sliding and laminating steps, the tray 62 and the first image bearing element 410', substrate 400 and carrier plate 34 on the tray 62 are cooled by the pre-proof temperature controlling assembly 8 to about the third temperature T3 above room temperature and below the first temperature.

The first removable support 414 is then peeled and/or removed from the first image bearing element 410'. The first adhesive layer 411 can remain or substantially remain on the first image bearing element 419. The resulting laminate can be called a modified first image bearing element 419. See FIG. 15.

Figure 15:
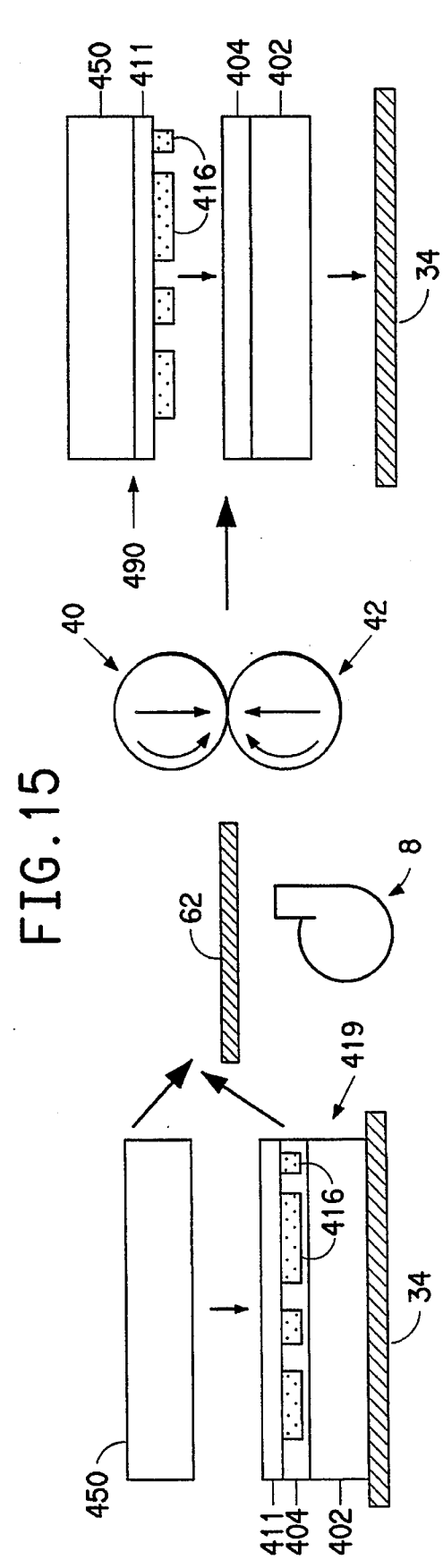
FIG. 15 is a schematic illustration of laminating by applying pressure and heat through a nip between a first roller assembly and a second roller assembly to sandwich the receiving substrate having one colored image together with a transfer sheet.

Then, referring to FIG. 15, a transfer or display sheet 450, such as a sheet of paper, can be stacked on the modified first image bearing element 419 on the carrier plate 34 on the sheet preparation and feed table 14 of the laminator 12.

Then, the stacked transfer sheet 450, modified first image bearing element 419 and carrier,plate 34 are slid along the tray 62 into the nip 44 between the pair of roller assemblies 40,42 heated by the pre-proof temperature controlling assembly 8 to about the temperature T1 and which are parallel or substantially parallel.

Then, the stacked transfer sheet 450 is laminated to the modified first image bearing element 419 through the pair of heated rollers 40,42 set to apply a second operating pressure or linear force OLF2 on the first image bearing element 419 and the transfer sheet 450.

During the second sliding and second laminating steps, the tray 62 and the transfer sheet 450, the modified first image bearing element 419, and carrier plate 34 on the tray 62 are cooled by the pre-proof temperature controlling assembly 8 to about the temperature T3 above room temperature and below the first temperature T1.

This can form a single color right reading proof. Alternatively, the substrate 402 can be peeled from the first image bearing element forming a single color right reading proof 490.

Alternatively, rather than laminating a transfer sheet 450 to the first image bearing element 419, a second image bearing element 420' can be laminated to the first image bearing element 419. See FIG. 16.

Figure 16:
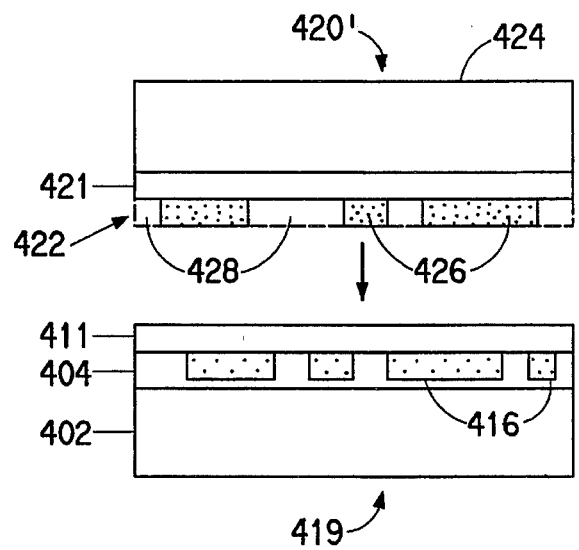
FIGS. 16–18 are schematic illustrations of intermediate laminating steps in a process of forming a multicolor proof.

The second image bearing element 420' can be made by repeating the exposing step, the processing step, the stacking step, the sliding step, the laminating step, the cooling step, and the peeling step with (1) a second precolored photosensitive element 420 comprising a second aqueously developable precolored photosensitive layer 422 on a second removable support 424 instead of the first element, (2) a second color separation transparency instead of the first transparency, (3) in the stacking step, stacking the second image bearing element 420' substantially in register on the modified first image bearing element 419, rather than on the substrate 400, and (4) in the laminating step, laminating the second image bearing element 420' substantially in register on the modified first image bearing element 419, rather than on the substrate 400. This second laminating step is illustrated in FIG. 16.

Figure 17:
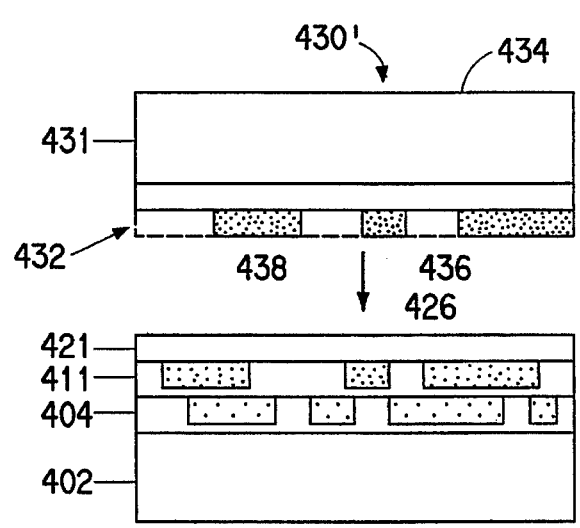

Then the first exposing step, the first processing step, the first stacking step, the first sliding step, the first laminating step, the first cooling step, and the first peeling step can be repeated with (1) a third precolored photosensitive element 430 comprising a third aqueously developable precolored photosensitive layer 432 on a third removable support 434 instead of the first element, (2) a third color separation transparency instead of the first transparency, (3) in the stacking step, stacking the third image bearing element 430' on the modified second image bearing element 429, rather than on the substrate 400, and substantially in register with the modified first image bearing element 419 and the modified second image bearing element 429, and (4) in the laminating step, laminating the third image bearing element 430' on the modified second image bearing element 429 substantially in register with the modified first image bearing element 419. This third laminating step is illustrated in FIG. 17.

Figure 18:
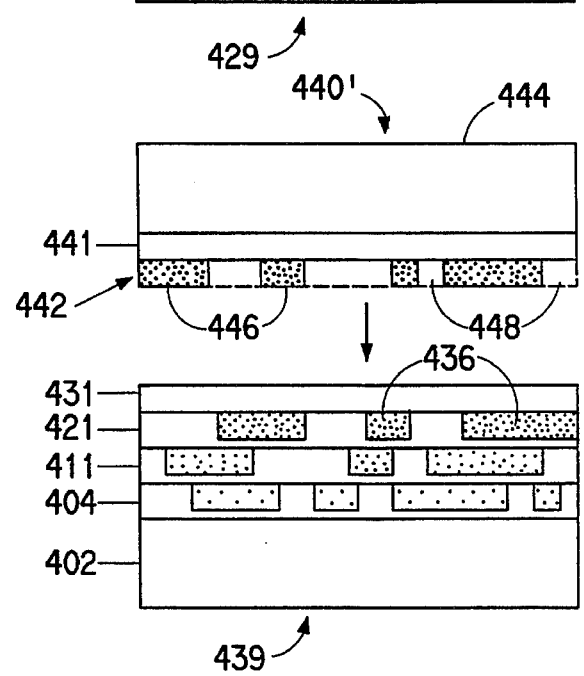

Then the first exposing step, the first processing step, the first stacking step, the first sliding step, the first laminating step, the first cooling step, and the first peeling step can be repeated with (1) a fourth precolored photosensitive element 440 comprising a fourth aqueously developable precolored photosensitive-layer 442 on a fourth removable support 444 instead of the first element, (2) a fourth color separation transparency instead of the first transparency, (3) in the stacking step, stacking the fourth image bearing element 440' on the modified third image bearing element 439, rather than on the substrate 400, and substantially in register with the modified first image bearing element 419, the modified second image bearing element 429 and the modified third image bearing element 439, and (4) in the laminating step, laminating the fourth image bearing element 440' on the modified third image bearing element 439 substantially in register with the modified first image bearing element 419. This fourth laminating step is illustrated in FIG. 18.

Suitable illustrative photosensitive elements 410,420,430, 440 that can be used in the present invention are disclosed in U.K. Patent publication GB 2144867 B. For instance, the photosensitive elements 410,420,430,440 can include from one side to the other a base layer, a thin release layer or coating, a thin heat sealable adhesive layer or coating and a photosensitive layer. When a release layer is included, preferably it is peeled off with the base layer as part of the removable supports 414,424,434,444 in the peeling steps. In other words, in reference to FIGS. 14–19, each one of the support layers 414,424,434,444 may comprise a plurality of layers including, for instance, a base layer and a thin release layer or coating. Suitable illustrative intermediate receiving substrates 400 that can be used in the present invention are disclosed in U.S. Pat. Nos. 4,482,625 and 4,766,053. For instance, the intermediate receiving substrates 400 can include from one side to the other a protective removable cover sheet, a thin heat curable adhesive layer or coating, a thin release layer or coating, a thin first anchor layer or coating, a polyester base layer, a thin second anchor layer or coating, and a thin anti static layer or coating. When the receiving substrate 400 includes a release layer, preferably it is peeled off with its base layer in the last peeling step after the last laminating step. Thus, in reference to FIGS. 14–19, the support layer 402 may comprise a plurality of layers including, for instance, a thin release layer or coating, a thin first anchor layer or coating, a polyester base layer, a thin second anchor layer or coating, and a thin anti static layer or coating.

The order of some of the steps is unimportant. For instance, all of the photosensitive elements that are going to be laminated together can be exposed and then developed in any order prior to laminating them onto the receiving substrate or prior laminate. For instance, all of the photosensitive elements that are going to be laminated together can be exposed and developed prior to any of the laminating steps. Alternatively, after one photosensitive element is exposed and developed, it can be laminated to the receiving substrate or prior laminate before any other photosensitive element is exposed and developed.

Figure 19:
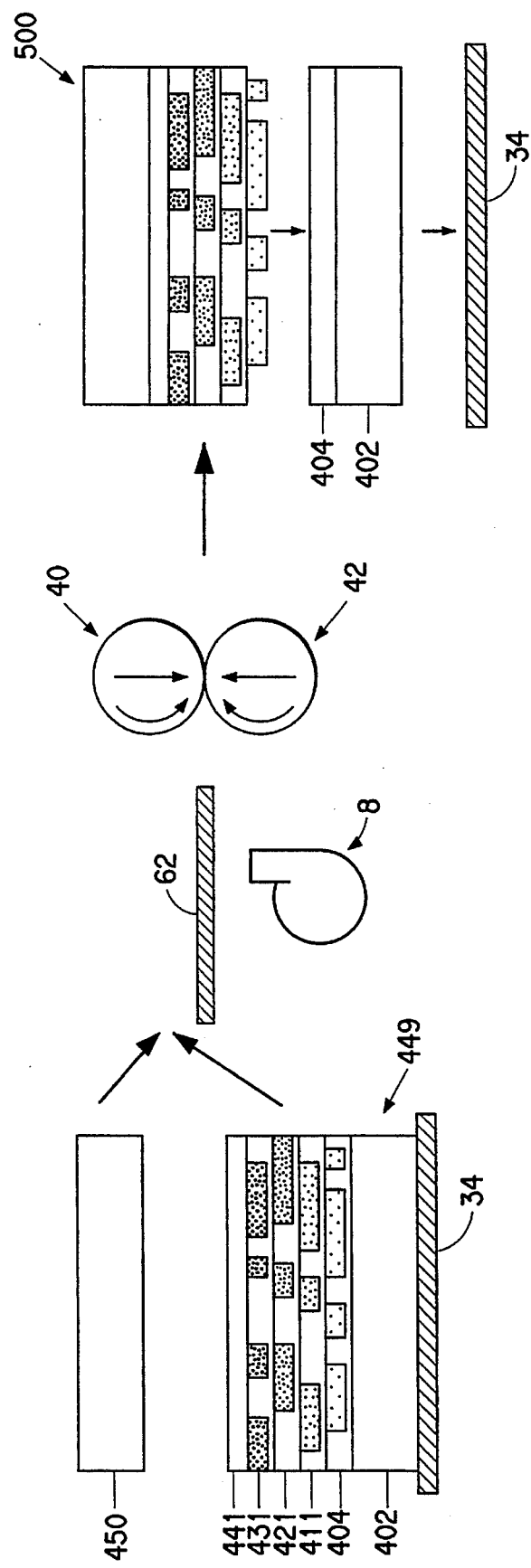
FIG. 19 is a schematic illustration of laminating by applying pressure and heat through a nip between a first roller assembly and a second roller assembly to sandwich the receiving substrate having four colored images together with a transfer sheet.

Finally, as illustrated in FIG. 19, a transfer or display sheet 450, such as a sheet of paper, is laminated to the fourth image bearing element 449 through the pair of heated roller assemblies 40,42 set to apply a second operating pressure or linear force OLF2 on the multicolor bearing element 449, the transfer sheet 450 and the carrier plate 34 sandwiching the first, second, third and fourth image bearing elements. This forms a four color right reading proof. Further, the support 402 of the substrate 400 can be peeled away and/or removed from the first image bearing element forming a four color right reading proof 500. The adhesive layer 404 originally forming part of the intermediate receiving substrate 404 can be (1) transferred to the transfer sheet 450 along with the multicolor image, (2) retained on the support 402 or (3) divided with part transferring to the transfer sheet 450 and part staying on the support 402. FIG. 19 is a schematic illustration of laminating by applying pressure and heat through the nip 44 set at a second operating pressure or linear force OLF2 between the first roller assembly 40 and the second roller assembly 42 to sandwich the receiving substrate 449 having four colored images together with a transfer sheet 450 on a carrier plate 34.

Proper lamination occurs in specific and possibly different pressure (or linear force) ranges, temperature ranges and transport speed ranges depending on the materials being laminated together. However, preferably, the linear force applied by the lower roller assembly 42 on the upper roller assembly 40 is at or about 5.35 pounds per linear inch for each of the lamination steps except the last laminating step. Preferably, the linear force applied by the lower roller assembly 42 on the upper roller assembly 40 is at or about 16 pounds per linear inch for the last lamination step. Preferably, the transport speed is at or about 400 millimeters per minute for each of the lamination steps. Under these preferred conditions, when a four color proof is made by one skilled in the art in accordance with the above described method of the present invention, the second, third and fourth images will typically be in register within about 60 microns with respect to the first image.

Before the last laminating step (illustrated in either FIG. 15 or 19) where the transfer sheet 450 is laminated to the multicolor image bearing substrate 419 or 449, the first exposing step, the first processing step, the first stacking step, the first sliding step, the first laminating step, the first cooling step, and the first peeling step can be repeated one or more times with (1) an nth precolored photosensitive element comprising a nth aqueously developable precolored photosensitive layer on an nth removable support instead of the first element, (2) an nth color separation transparency instead of the first transparency, (3) in the stacking step, stacking the nth image bearing element on the modified nth minus one image bearing element, rather than on the substrate, and substantially in register with the modified first image bearing element, and (4) in the laminating step, laminating the nth image bearing element on the modified nth minus one image bearing element and substantially in register with the modified first image bearing element. Then in the last laminating step, the transfer sheet 450 is laminated to the modified nth image bearing element.

Those skilled in the art, having the benefit of the teachings of the present invention as hereinabove set forth, can effect numerous modifications thereto. These modifications are to be construed as being encompassed within the scope of the present invention as set forth in the appended claims.

What is claimed is:

1. An off-press method for laminating a first precolored image photosensitive element to an image receiving substrate supported on a carrier plate and then transferring the color image from the receiving substrate to a transfer sheet to form a proof, comprising:

exposing the first precolored photosensitive element comprising a first aqueously developable precolored photosensitive layer on a first removable support through a first color separation transparency forming first image areas and first non-image areas in the first aqueously developable precolored layer;

processing the exposed first element to develop a first color image by washing away the first non-image areas with water;

stacking the first image bearing element in registration on the substrate on the carrier plate on a sheet preparation and feed table of a laminator;

sliding the stacked first image bearing element, substrate and carrier plate along a tray into a nip between a pair of rollers heated to about a temperature T1 and which are parallel or substantially parallel;

laminating the stacked first image bearing element to the substrate by transporting the first image bearing element on the substrate and the carrier plate through a pair of heated rollers;

during the sliding and laminating steps, cooling the tray and the first image bearing element, substrate and carrier plate on the tray to about a temperature T3 above room temperature and below the temperature T1;

peeling the removable support from the first image bearing element resulting in a modified first image bearing element;

stacking a transfer sheet on the modified first image bearing element on the carrier plate on the sheet preparation and feed table of the laminator;

sliding the stacked transfer sheet, modified first image bearing element, and carrier plate along the tray into the nip between the pair of rollers heated to about the temperature T1 and which are parallel or substantially parallel;

laminating the transfer sheet to the first image bearing element through the pair of heated rollers; and during the second sliding and second laminating steps, cooling the tray and the first image bearing element, transfer sheet and carrier plate on the tray to about the temperature T3 above room temperature and below the first temperature.

2. The off-press method of claim 1, further comprising:

peeling the substrate from the first image bearing element forming a single color right reading proof.

3. An off-press method for laminating precolored photosensitive image elements to an image receiving substrate supported on a carrier plate and then transferring multicolor images from the receiving substrate to a transfer sheet to form a proof, comprising:

exposing a first one of the precolored photosensitive elements comprising a first aqueously developable precolored photosensitive layer on a first removable support through a first color separation transparency forming first image areas and first non-image areas in the first aqueously developable precolored layer;

processing the exposed first element to develop a first color image by washing away the first non-image areas with water;

stacking the first color image bearing element on the substrate on the carrier plate on a sheet preparation and feed table of a laminator;

sliding the stacked first color or image bearing element, substrate and carrier plate along a tray into a nip between a pair of rollers heated to about a temperature T1 and which are parallel or substantially parallel;

laminating the stacked first color image bearing element to the substrate by transporting the first color image bearing element on the substrate and the carrier plate through a pair of heated rollers;

during the sliding and laminating steps, cooling the tray and the first color image bearing element, substrate and carrier plate on the tray to about a temperature T3 above room temperature and below the temperature T1;

peeling the removable support from the first color image bearing element resulting in a modified first color image bearing element;

repeating the exposing step, the processing step, the stacking step, the sliding step, the laminating step, the cooling step, and the peeling step with (1) a second one of the precolored photosensitive elements comprising a second aqueously developable precolored photosensitive layer on a second removable support instead of the first element, (2) a second color separation transparency instead of the first transparency, (3) in the stacking step, stacking the second image bearing element substantially in register on the modified first image bearing element, rather than on the substrate, and (4) in the laminating step, laminating the second image bearing element substantially in register on the modified first image bearing element, rather than on the substrate;

repeating the first exposing step, the first processing step, the first stacking step, the first sliding step, the first laminating step, the first cooling step, and the first peeling step with (1) a third one of the precolored photosensitive elements comprising a third aqueously developable precolored photosensitive layer on a third removable support instead of the first element (2) a third color separation transparency instead of the first transparency, (3) in the stacking step, stacking the third image bearing element on the modified second image bearing element, rather than on the substrate, and substantially in register with the modified first image bearing element and the modified second image bearing element, and (4) in the laminating step, laminating the third image bearing element on the modified second image bearing element, rather than on the substrate, and substantially in register with the modified first image bearing element and the modified second image bearing element;

repeating the first exposing step, the first processing step, the first stacking step, the first sliding step, the first laminating step, the first cooling step, and the first peeling step with (1) a fourth one of the precolored photosensitive elements comprising a fourth aqueously developable precolored photosensitive layer on a fourth removable support instead of the first element, (2) a fourth color separation transparency instead of the first transparency, (3) in the stacking step, stacking the fourth image bearing element on the third image bearing element, rather than on the substrate, and substantially in register with the first image bearing element, the second image bearing element and the third image bearing element, and (4) in the laminating step, laminating the fourth image bearing element on the modified third image bearing element, rather than on the substrate, and substantially in register with the modified first image bearing element, the modified second image bearing element and the modified third image bearing element;

stacking a transfer sheet on the modified fourth image bearing element on the carrier plate on the sheet preparation and feed table of the laminator;

sliding the stacked transfer sheet, modified fourth image bearing element, and carrier plate along the tray into the nip between the pair of rollers heated to about the temperature T1 and which are parallel or substantially parallel;

laminating the transfer sheet to the fourth image bearing element through the pair of heated rollers; and during the immediately preceding sliding and laminating steps, cooling the tray and the fourth image bearing element, transfer sheet and carrier plate on the tray to about the temperature T3 above room temperature and below the first temperature.

4. The off-press method of claim 3, further comprising:

peeling the substrate from the first image bearing element forming a four color right reading proof.

5. The off-press method of claim 4, further comprising:

before the last laminating step where the transfer sheet is laminated to the multicolor image bearing substrate, repeating at least one more time the first exposing step, the first processing step, the first stacking step, the first sliding step, the first laminating step, the first cooling step, and the first peeling step with (1) an nth one of the precolored photosensitive elements comprising an nth aqueously developable precolored photosensitive layer on an nth removable support instead of the first element, (2) an nth color separation transparency instead of the first transparency, (3) in the stacking step, stacking the nth image bearing element on the modified nth minus one image bearing element, rather than on the substrate, and substantially in register with the modified first image bearing element, and (4) in the laminating step, laminating the nth image bearing element on the modified nth minus one image bearing element, rather than on the substrate, and substantially in register with the modified first image bearing element; and in the last laminating step, the transfer sheet is laminated to the modified nth image bearing element.

\* \* \* \* \*